(12) United States Patent
Hasumi et al.

(10) Patent No.: US 8,058,891 B2
(45) Date of Patent: Nov. 15, 2011

(54) DELAY LOCK LOOP CIRCUIT, TIMING GENERATOR, SEMICONDUCTOR TEST DEVICE, SEMICONDUCTOR INTEGRATED CIRCUIT, AND DELAY AMOUNT CALIBRATION METHOD

(75) Inventors: Takuya Hasumi, Tokyo (JP); Masakatsu Suda, Tokyo (JP)

(73) Assignee: Advantest Corp., Toyko (JP)

( * ) Notice: Subject to any disclaimer, the term of this patent is extended or adjusted under 35 U.S.C. 154(b) by 586 days.

(21) Appl. No.: 12/083,577

(22) PCT Filed: Oct. 18, 2006

(86) PCT No.: PCT/JP2006/320751
§ 371 (c)(1),
(2), (4) Date: Jul. 8, 2008

(87) PCT Pub. No.: WO2007/049490
PCT Pub. Date: May 3, 2007

(65) Prior Publication Data
US 2009/0256577 A1    Oct. 15, 2009

(30) Foreign Application Priority Data
Oct. 26, 2005    (JP) .................................. 2005-311661

(51) Int. Cl.
*G01R 31/02* (2006.01)
*G01R 31/26* (2006.01)

(52) U.S. Cl. .................................................. 324/762.01
(58) Field of Classification Search .................. None
See application file for complete search history.

(56) References Cited

U.S. PATENT DOCUMENTS

| 6,466,058 B1 | 10/2002 | Goldman | |
|---|---|---|---|
| 2004/0247066 A1 * | 12/2004 | Suda | 375/376 |

FOREIGN PATENT DOCUMENTS

| JP | 09-23157 | 1/1997 |
|---|---|---|
| JP | 2003-69425 | 3/2003 |
| JP | 2004-350116 | 12/2004 |
| JP | 2005-20711 | 1/2005 |
| JP | 2005-51673 | 2/2005 |
| WO | WO 03/036796 | 5/2003 |
| WO | WO 03-036796 | 5/2003 |

* cited by examiner

*Primary Examiner* — Roberto Velez
(74) *Attorney, Agent, or Firm* — Muramatsu & Associates

(57) ABSTRACT

A delay lock loop circuit and its delay amount calibration method is disclosed. An initially set value of a counter is determined by a technique which replaces measurement of a delay amount, whereby a time required for calibration of a delay circuit can be reduced. One counter set value of a plurality of counter set values is loaded, a delay lock loop circuit is switched to a lock mode, and a sequence circuit of a cycle slip detection circuit is reset. Thereafter, a cycle slip detection signal output from the sequence circuit is read, and based on the reading, it is judged whether or not an output signal of a delay circuit causes cycle slip. If the cycle slip is caused, the counter set value is switched. If any cycle slip is not caused, the counter set value is locked, thereby terminating the process.

7 Claims, 20 Drawing Sheets

OWING TO FEEDBACK IN SAME DIRECTION, CYCLE SLIP OCCURS, WHEN DELAY AMOUNT IS 1.5 PERIODS OR MORE

OWING TO FEEDBACK IN SAME DIRECTION, CYCLE SLIP OCCURS, WHEN DELAY AMOUNT IS 0.5 PERIOD OR LESS

DELAY LOCK LOOP CIRCUIT, TIMING GENERATOR, SEMICONDUCTOR TEST DEVICE, SEMICONDUCTOR INTEGRATED CIRCUIT, AND DELAY AMOUNT CALIBRATION METHOD

TECHNICAL FIELD

The present invention relates to a delay lock loop circuit (DLL) which controls so that a delay amount given to an output signal of a delay circuit becomes a predetermined value, a timing generator using this DLL, a semiconductor test device including this timing generator, a semiconductor integrated circuit including the above DLL, and a delay amount calibration method for calibrating a delay amount given to an output signal.

BACKGROUND ART

Heretofore, a delay locked loop (DLL) circuit has been known as one means such as a frequency multiplier.

The DLL is a circuit which controls and adjusts, by a circuit technology, a time difference (a phase difference) between a reference clock signal (an input signal) provided from the outside and an inner clock signal, to generate a clock signal at a high speed and a high operation frequency.

The objects of using the DLL include reduction of a lock-up time, improvement of precision of a delay amount and the like from the viewpoints of a function, and the like, and to achieve these objects, a DLL of digital control has been proposed instead of a conventional DLL of analog control (e.g., see International Publication No. W003/036796).

Here, a circuit constitution example of the conventional DLL will be described with reference to FIGS. 19(*i*), (*ii*). FIG. 19(*i*) is a block diagram showing a conventional DLL circuit constitution, and FIG. 19(*ii*) is a graph showing a change of each signal with time in the conventional DLL.

As shown in FIG. 19(*i*), a conventional DLL 100 includes a delay circuit 110, a phase comparator 120, a counter 130 and a DA converter (DAC) 140.

The delay circuit 110 has a constitution in which a plurality of delay elements each having an equal delay amount are connected in series, and supplies a predetermined delay amount to an input signal (a reference signal, an input clock in FIG. 19) to generate the delayed signal as an output signal.

The phase comparator 120 inputs the output signal (an output waveform) of the delay circuit 110 together with the input signal (an input waveform). Then, a value of the output signal is detected in synchronization with the input signal. This detection result is output as a phase signal indicating an advance or a delay of a phase of the output signal with respect to the input signal (FIGS. 19(*ii*)(*a*), (*b*) and (*c*)).

The counter 130 has a function of a priority encoder, and produces a control signal constituted of a plurality of bits in accordance with the phase signal from the phase comparator 120 (FIG. 19 (ii) (*c*), (*d*)).

The DA converter (a delay time acquiring section) 140 receives the control signal from the counter 130 and outputs a delay time signal indicating a delay time corresponding to the bit value of the control signal.

Then, the delay circuit 110 adds a predetermined delay amount to the output signal, based on a delay time signal input from the DA converter 140. Here, when a large number of bits indicate "H" in the delay time signal, the delay circuit 110 increases the delay time of the output signal with respect to the input signal. On the other hand, when a small number of bits indicate "H" in the delay time signal, the delay time of the output signal with respect to the input signal is decreased. According to such an operation, the output signal having a constant delay amount with respect to the input signal can be generated.

In the conventional DLL, however, in a case where the number of the bits of a counter is increased so as to broaden a lock range, there has been a problem that the number of the bits becomes enormous.

On the other hand, in a case where a change amount (resolution) of the delay time with respect to a change of one bit of a counter value is increased so that the counter does not have the enormous number of the bits, there has been a problem that jitter cannot sufficiently be reduced.

To solve the problem, a technology in which the conventional DLL is improved is suggested.

A constitution of the DLL according to this improved technology is shown in FIG. 20.

As shown in the drawing, a DLL 200-1 includes, for example, a delay circuit 210 in which a plurality of delay elements each having an equal delay amount are connected in series, a plurality of phase comparators 220*a*, 220*b* which receive an input signal and an output signal of the delay circuit 210 to output a phase signal, a plurality of counters 230*a*, 230*b* which receive the phase signal from the corresponding phase comparator 220 to output a control signal, a plurality of delay time acquiring sections (DA converters (DAC)) 240*a*, 240*b* which receive the control signal from the corresponding counter 230 to output a delay time signal indicating a delay time corresponding to a bit value of the input control signal, an adding section 250 which adds up the delay time indicated by each delay time signal output from each of these delay time acquiring sections 240, and a delay time control section (a bias circuit) 260 which converts a delay time sum added up by the adding section 250 into the delay time of each delay element of the delay circuit 210.

In the example of FIG. 20, two phase comparators 220, two counters 230 and two DA converters 240 are provided, respectively. One of the components constitutes a fine (fine resolution) system, and the other component constitutes a coarse (coarse resolution) system. Here, as shown in FIG. 21, a small deviation from one period of the input signal is processed by a fine section. On the other hand, in a case where digit carrying or lowering occurs in the fine section or there is a large deviation from one period, a coarse section processes this case.

In consequence, the delay amount of the delay circuit 210 is controlled so that the amount is just one period of the input signal. In addition, the lock range can be expanded without increasing the number of the bits of the counter 230.

Furthermore, a sum of the delay time with the coarse resolution and the delay time with the fine resolution is reflected in the compensation of the deviation of the delay amount, so that a lock-up time can rapidly be reduced as compared with a case where the resolution of the counter 230 is simply increased.

However, in case of processing a noise having a large amplitude, the counter 230 causes overflow (the count value exceeds an upper limit of a predetermined range) or underflow (the count value exceeds a lower limit of the predetermined range). To avoid this, it is supposed that the number of the bits of the counter 230 is increased, however this has a demerit that a circuit scale enlarges.

To solve the problem, as shown in FIG. 22, a DLL 200-2 includes a control circuit (a controller) 270 which controls operations of counters 230*a*, 230*b* of the respective systems. Then, in a case where a count value exceeds a predetermined range in the fine system counter (a first counter) 230*a* and the coarse system counter (a second counter) 230b outputs a phase signal HOLD, the count value is set to a half value with respect to the counter 230a, and the value is counted up (digit carrying) or down (digit lowering) with respect to the counter 230b.

Thus, a delay component having a small resolution and a delay component having a large resolution are subjected to digit carrying/lowering processing, whereby the lock range can be broadened without enlarging the circuit scale of the counter, and the overflow and underflow in the counter 230 can be avoided.

As described above, the conventional DLLs 200-1, 200-2 each including the fine section and the coarse section are very effective as means for solving the above problems, for example, so that a lock range can be broadened without enlarging a circuit scale of a counter as compared with the conventional DLL 100 including only one phase comparator or the like.

However, in the DLL, a delay amount of the delay circuit 210 largely fluctuates owing to a fluctuation of a CMOS process, a voltage and a temperature. For example, even with an equal set value of a DA converter, a delay amount sometimes exceeds 1.5 periods, and does not reach a 0.5 period. In this case, it is supposed that cycle slip might occur in an output signal of the delay circuit.

As shown in FIGS. 23, 24, the cycle slip is a phenomenon in which an output signal of the delay circuit has a delay amount larger or smaller than a predetermined range (e.g., a range of a 1.5 period delay to a 0.5 period delay) including a true delay amount (e.g., a delay amount of a 1 period delay) of the output signal of the delay circuit, and hence compensation is performed in a direction reverse to a correct compensating direction, thus it becomes impossible to compensate the delay amount.

It is to be noted that FIG. 23 shows a state in which the cycle slip occurs in a case where the delay amount of the delay circuit is larger than 1.5 periods, and FIG. 24 shows a state in which the cycle slip occurs in a case where the delay amount of the delay circuit is smaller than 0.5 period.

To avoid such cycle slip, heretofore the delay amount of the delay circuit is measured for each DLL circuit, and an appropriate counter initially set value is determined so that this delay amount is a value around the one period delay of an input signal.

However, in a conventional measurement method of the delay amount, the set value of the counter is switched one by one, and loaded, and the delay amount is measured for each switching, so that calibration of the delay circuit requires a long time.

SUMMARY OF THE INVENTION

The present invention has been developed in view of the above situation, and an object thereof is to provide a delay lock loop circuit capable of determining an initially set value of a counter by a technique which replaces measurement of a delay amount, to reduce a time required for calibration of a delay circuit, a timing generator, a semiconductor test device, a semiconductor integrated circuit and a delay amount calibration method.

To achieve this object, a delay lock loop circuit according to the present invention includes: a delay circuit in which a plurality of delay elements each having an equal delay amount are connected in tandem and which provides a predetermined delay amount to an input signal to generate the delayed signal as an output signal; a phase comparator which outputs a phase signal based on a phase difference between the input signal and the output signal; a counter which receives the phase signal from the phase comparator to output a control signal; and a delay time acquiring section which receives the control signal from the counter to output a delay time signal, the delay lock loop circuit being provided with a cycle slip detection circuit which detects whether or not the output signal causes cycle slip, and count control means for controlling a count value of the counter in a case where it is detected that the cycle slip is caused.

According to such a constitution of the delay lock loop circuit, the cycle slip detection circuit can automatically detect whether or not the output signal of the delay circuit causes the cycle slip, and the count control means can automatically control the count value of the counter based on this detection result. In consequence, switching of an initially set value of the counter, loading of the set value of the counter, and execution of a lock mode can be performed only about several times, to easily find an appropriate set value.

This obviates the need for an operation of measuring the delay amount of the delay circuit every time the set value of the counter is loaded. Therefore, the above cycle slip detection circuit and count control means are provided as a technique which replaces the measurement of the delay amount, whereby the appropriate initially set value of the counter can easily and quickly be determined, and the time required for the calibration of the delay circuit can be reduced.

Moreover, in the delay lock loop circuit of the present invention, the cycle slip detection circuit has a logical circuit which inputs the input signal and the output signal to output a phase difference detection signal indicating whether or not a phase of the input signal matches that of the output signal, and a sequence circuit which outputs a cycle slip detection signal indicating whether or not the output signal causes the cycle slip, based on the phase difference detection signal from this logical circuit.

According to the delay lock loop circuit having such a constitution, it can be judged whether or not the output signal causes the cycle slip, on the basis of the cycle slip detection signal from the sequence circuit.

For example, when the initially set value of the counter is loaded and the DLL is set to the lock mode to reset the sequence circuit, the cycle slip detection signal from the sequence circuit has a value which differs depending on whether or not the output signal causes the cycle slip. For example, the signal indicates "H" when the cycle slip is caused, and the signal indicates "L" when the cycle slip is not caused.

Therefore, the cycle slip detection circuit in which the logical circuit and the sequence circuit are combined can detect whether or not the cycle slip is generated, and the delay circuit can be calibrated in accordance with this detection result.

Furthermore, in the delay lock loop circuit of the present invention, the logical circuit has a circuit in which an AND circuit and a negative circuit to deny one input signal of this AND circuit are combined, or an exclusive OR circuit.

According to the delay lock loop circuit having such a constitution, in a case where the cycle slip occurs in the output signal, an output waveform of the logical circuit can be output as a glitch waveform which repeats "H" and "L". Therefore, in the sequence circuit, when the cycle slip does not occur, a signal "L" can be output. When the cycle slip occurs, a signal "H" can be output. In consequence, the cycle slip detection circuit can detect the cycle slip.

Moreover, in the delay lock loop circuit of the present invention, the sequence circuit includes one or more of an S-R latch circuit, a D flip-flop circuit and a D-latch circuit.

According to the delay lock loop circuit having such a constitution, on the basis of a signal from the logical circuit, the sequence circuit can output the signal "L" when the cycle slip does not occur, and can output the signal "H" when the cycle slip occurs.

Furthermore, in the delay lock loop circuit of the present invention, the delay time acquiring section has a plurality of delay time acquiring sections having different resolutions, counters are provided corresponding to the plurality of delay time acquiring sections, and the count control means controls a count value of the counter provided corresponding to the delay time acquiring section having a coarse resolution.

According to the delay lock loop circuit having such a constitution, the initially set value of the counter can automatically be switched, and an appropriate set value to be locked in the lock mode can easily be found.

Moreover, in the delay lock loop circuit of the present invention, the cycle slip detection circuit has a maximum/minimum value detection circuit to detect whether or not the count value of the counter indicates a maximum value or a minimum value.

According to the delay lock loop circuit having such a constitution, it can easily be detected whether or not the output signal causes the cycle slip.

That is, in a state where the cycle slip is caused, a phase of the output signal largely delays or advances with respect to the input signal, so that the count value of the counter indicating the maximum value or the minimum value is fixed (stuck) and is not locked.

Therefore, it is detected whether the count value of the counter indicates the maximum value or the minimum value, whereby it can be judged whether or not the output signal causes the cycle slip.

Moreover, a timing generator of the present invention includes: a delay lock loop circuit including a delay circuit in which a plurality of delay elements each having an equal delay amount are connected in series; and a delay selecting section which selects an output of one of the delay elements to generate the output as a delay signal, wherein the delay lock loop circuit is configured as described in the foregoing.

According to the timing generator having such a constitution, in a case where the timing generator includes one or more DLLs, a time required for calibration of these DLLs can be reduced.

Furthermore, a semiconductor test device of the present invention includes: a timing generator to output a delay clock signal in which a reference clock signal is delayed by a predetermined time; a pattern generator which outputs a test pattern signal in synchronization with the reference clock signal; a waveform shaping unit which shapes the test pattern signal in accordance with a device under test to apply the signal to the device under test; and a logical comparator which compares a response output signal of the device under test with an expected value data signal, wherein the timing generator is configured as described in the foregoing.

According to the semiconductor test device having such a constitution, one or more DLLs provided in the timing generator can be calibrated in a short time.

In addition, a semiconductor integrated circuit of the present invention includes: a plurality of delay lock loop circuits each having an equal oscillation frequency; and a wire which distributes, to the delay lock loop circuits, a reference clock signal having a frequency lower than the oscillation frequency, wherein the delay lock loop circuit is configured as described in the foregoing.

According to the semiconductor integrated circuit having such a constitution, in a case where one or more DLLs mounted on this semiconductor integrated circuit are provided in the timing generator, the time required for the calibration of these DLLs can be reduced.

In addition, CLK transmission in a long distance is performed at a low frequency, and multiplication is performed using the DLL in a local section, so that a circuit scale and power consumption of a transmitting section can be reduced. The whole buffer stage number is minimized, and skew can be reduced.

This is because, when the CLK transmission at a high frequency in a long distance in an LSI is performed, as compared with the CLK transmission at a low frequency, processing of reducing a buffer interval to reduce a load capacity or processing of increasing a driving capability of a buffer is necessary, and either case results in increase of circuit scale and power consumption. Moreover, there is a large difference of the number of the buffer stages between blocks, so that the skew also increases.

Moreover, a delay amount calibration method of the present invention in which a delay amount given to an output signal by a delay circuit of a delay lock loop circuit is calibrated, comprising: loading one of a plurality of initially set values in a counter; executing a lock mode so that the delay amount of the output signal is equal to a predetermined delay amount of the delay circuit with respect to an input signal; loading another initially set value to execute the lock mode in a case where a cycle slip detection circuit detects cycle slip; and locking the delay amount of the output signal to end in a case where the cycle slip detection circuit does not detect any cycle slip.

According to such a method in the semiconductor integrated circuit, the delay circuit can be calibrated by a simple procedure in a short time.

EFFECT OF THE INVENTION

As described above, according to the present invention, a cycle slip detection circuit can automatically detect whether or not an output signal of a delay circuit causes cycle slip, and count control means can automatically control a count value of a counter based on this detection result. In consequence, switching of an initially set value of the counter, loading of the set value of the counter, and execution of a lock mode can be performed only about several times, to easily find an appropriate set value.

This obviates the need for an operation of measuring a delay amount of the delay circuit every time the set value of the counter is loaded. Therefore, the above cycle slip detection circuit and count control means are provided as a technique which replaces the measurement of the delay amount, whereby the appropriate initially set value of the counter can easily and quickly be determined, and a time required for calibration of the delay circuit can be reduced.

Figure 1:
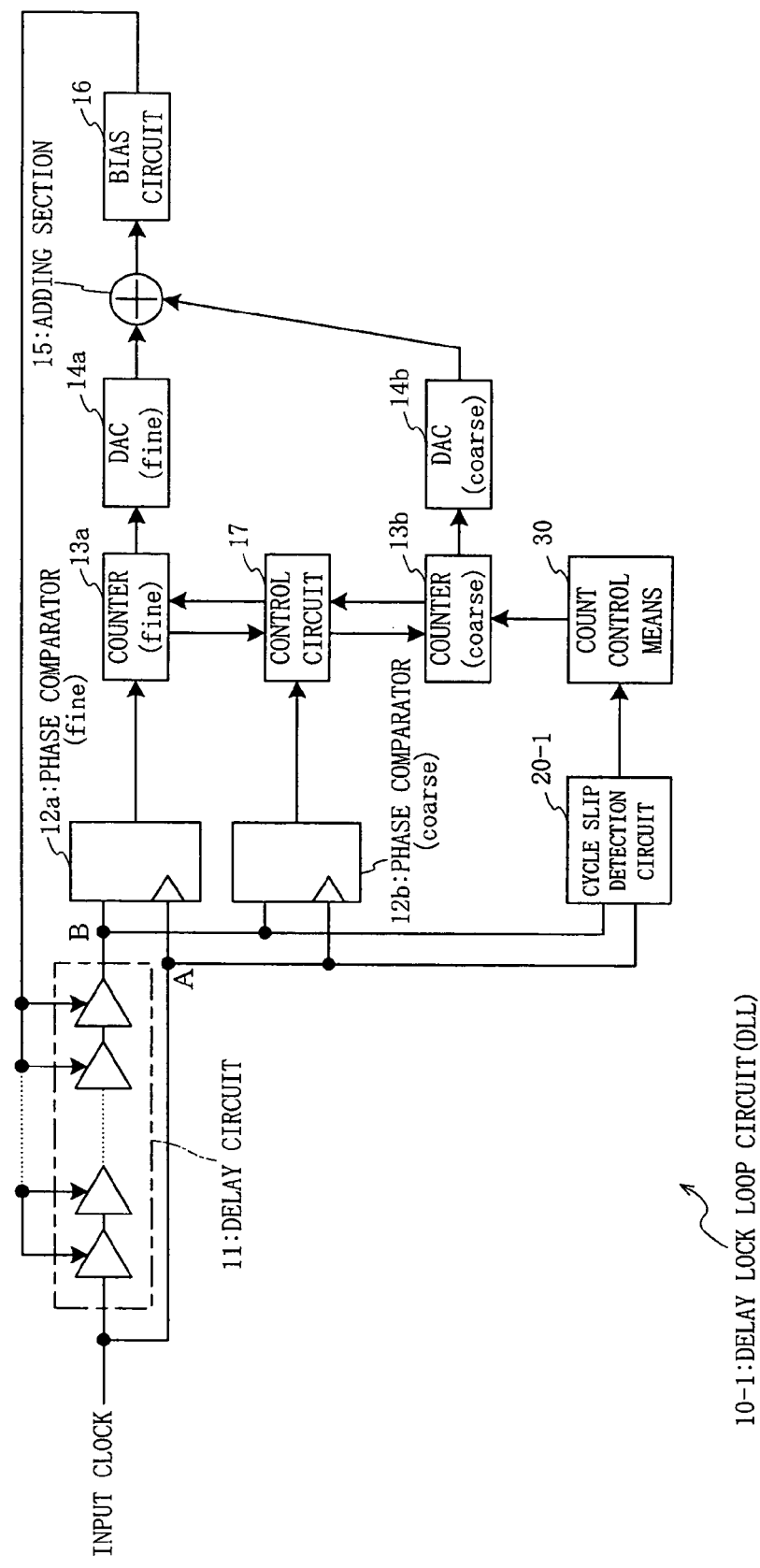
FIG. 1 is a block diagram showing a constitution of a delay lock loop circuit according to a first embodiment of the present invention.

DESCRIPTION OF REFERENCE NUMERALS 10-1, 10-2, 10-3, 10-4 delay lock loop circuits (DLLs)
11 a delay circuit
12a, 12b phase comparators
13a, 13b counters
14a, 14b DA converters (DACs)
15 an adding section
16 a bias circuit
17 a control circuit
20-1 a cycle slip detection circuit
21 a logical circuit
21-1 an exclusive OR circuit (a first logical circuit)
21-2 a second logical circuit
22 a sequence circuit
22-1 an S-R latch circuit
22-2 a D flip-flop circuit
22-3 a D-latch circuit
20-2 a maximum/minimum value detection circuit
30 count control means
31 a sequencer/counter
32 a decoder
33-1 to 33-n DA value (1 to N) realization logical circuits
34 a logical circuit
35 a reset signal generation logical circuit
40 a semiconductor test device
41 a timing generator
41-1 a DLL
50 a semiconductor integrated circuit
51-1 to 51-4 DLLs

BEST MODE FOR CARRYING OUT THE INVENTION

Preferable embodiments of a delay lock loop circuit, a timing generator, a semiconductor test device, a semiconductor integrated circuit and a delay amount calibration method according to the present invention will hereinafter be described with reference to the drawings.

First Embodiment of Delay Lock Loop Circuit

First, a first embodiment of a delay lock loop circuit according to the present invention will be described with reference to FIG. 1.

The drawing is a block diagram showing a constitution of the delay lock loop circuit of the present embodiment.

As shown in the drawing, a delay lock loop circuit 10-1 has a delay circuit 11, phase comparators 12a, 12b, counters 13a, 13b, DACs 14a, 14b, an adding section 15, a bias circuit 16, a control circuit 17, a cycle slip detection circuit 20-1, and count control means 30.

Figure 22:
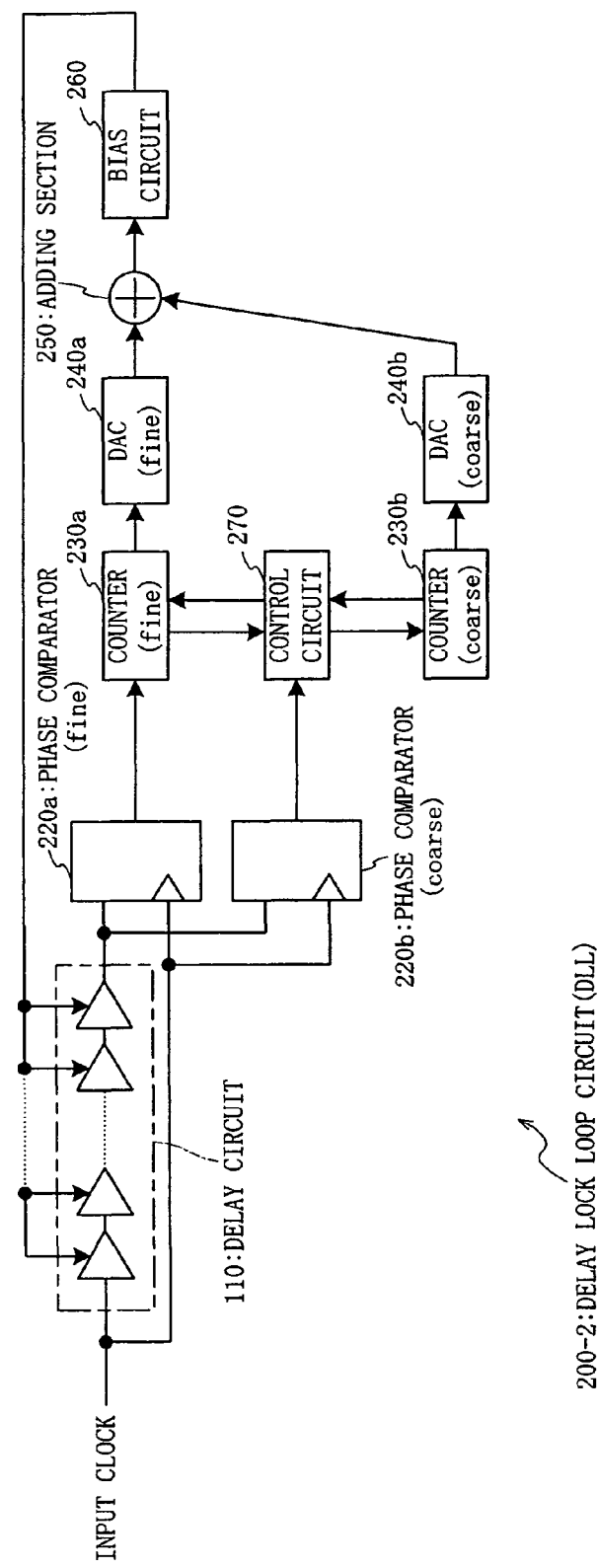
FIG. 22 is a circuit diagram showing still another constitution of the conventional delay lock loop circuit.
Figure 23:
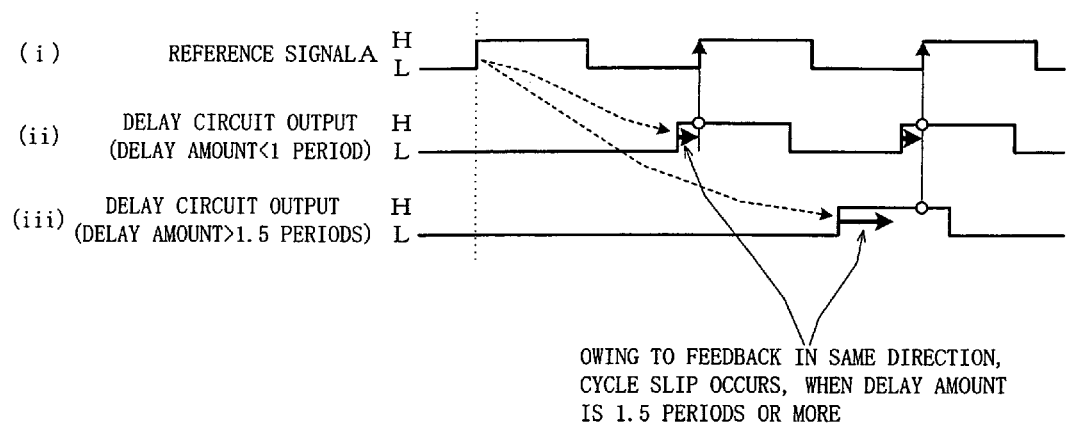
FIG. 23 is a waveform diagram showing a state in which cycle slip is caused in a case where a delay amount of a delay circuit is longer than 1.5 periods.
Figure 24:
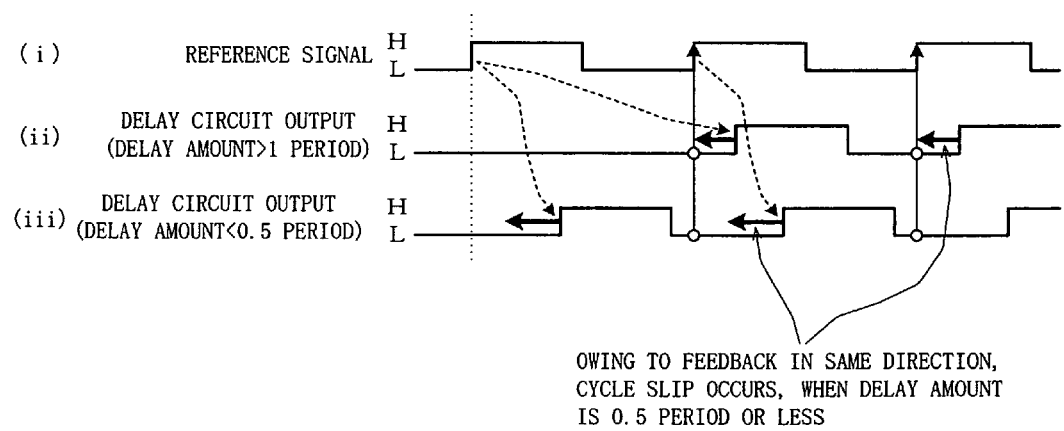
FIG. 24 is a waveform diagram showing a state in which the cycle slip is caused in a case where the delay amount of the delay circuit is shorter than 0.5 period.

It is to be noted that the delay circuit 11, the phase comparators 12a, 12b, the counters 13a, 13b, the DACs 14a, 14b, the adding section 15, the bias circuit 16 and the control circuit 17 have functions similar to those of the delay circuit 210, the phase comparators 220a, 220b, the counters 230a, 230b, the DACs 240a, 240b, the adding section 250, the bias circuit 260 and the control circuit 270 of the conventional delay lock loop circuit 200-2 shown in FIG. 22, and hence detailed description thereof is omitted.

Here, the cycle slip detection circuit 20-1 is a circuit which compares an input signal of the delay circuit 11 with an output signal thereof to detect whether or not the output signal causes cycle slip.

Figure 2:
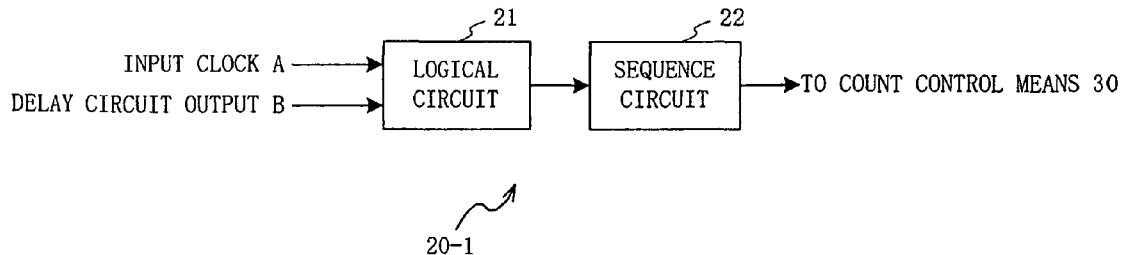
FIG. 2 is a block diagram showing a constitution of a cycle slip detection circuit.

As shown in FIG. 2, this cycle slip detection circuit 20-1 has a logical circuit 21 and a sequence circuit 22.

The logical circuit 21 receives an input signal (an input clock A) of the delay circuit 11 and an output signal (a delay circuit output B) of the circuit, outputs a signal (a phase difference detection signal) having a glitch and repeating "H" and "L" when there is a phase difference between the input signal and the output signal, and outputs the phase difference detection signal indicating "L" when there is no phase difference.

As shown in FIG. 3(i), this sequence circuit 22 may be constituted of, for example, an exclusive OR circuit (an XOR circuit, a first logical circuit) 21-1. A logical formula of this first logical circuit 21-1 is, for example, (A·NOT(B))+(NOT (A)·B) or the like.

Figure 3:
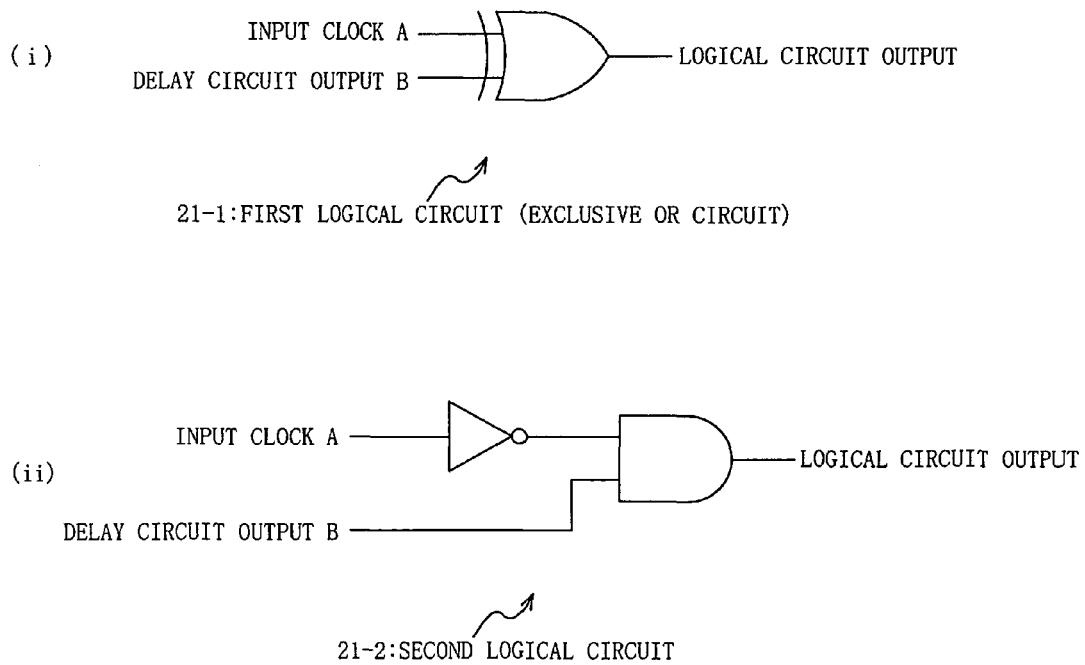
FIG. 3 is a circuit diagram showing a specific example of a logical circuit constituting the cycle slip detection circuit, (i) shows an exclusive OR circuit as a first logical circuit, and (ii) shows a negative circuit and an AND circuit as a second logical circuit.

As shown in FIG. 3(ii), the logical circuit 21 may be constituted of, for example, a circuit (a second logical circuit 21-2) in which an AND circuit and a negative circuit to deny one input of this AND circuit are combined. A logical formula of this second logical circuit 21-2 is NOT (A)·B.

It is to be noted that in the second logical circuit 21-2, an input clock A and a delay circuit B may be reversed. That is, a logical formula may be A·NOT(B).

The sequence circuit 22 outputs a cycle slip detection signal based on the phase difference detection signal from the logical circuit 21. For example, when the phase difference detection signal is indicating "L", the cycle slip detection signal is "L". On the other hand, when the phase difference detection signal is repeating "H" and "L" and having a glitch, the cycle slip detection signal is "H".

As shown in FIG. 4(i), this sequence circuit 22 may be constituted of an S-R latch circuit (a first sequence circuit) 22-1. In this S-R latch circuit 22-1, an output (the phase difference detection signal) of the logical circuit 21 is input into a set (S) side, and a reset signal is input into a reset (R) side.

Figure 4:
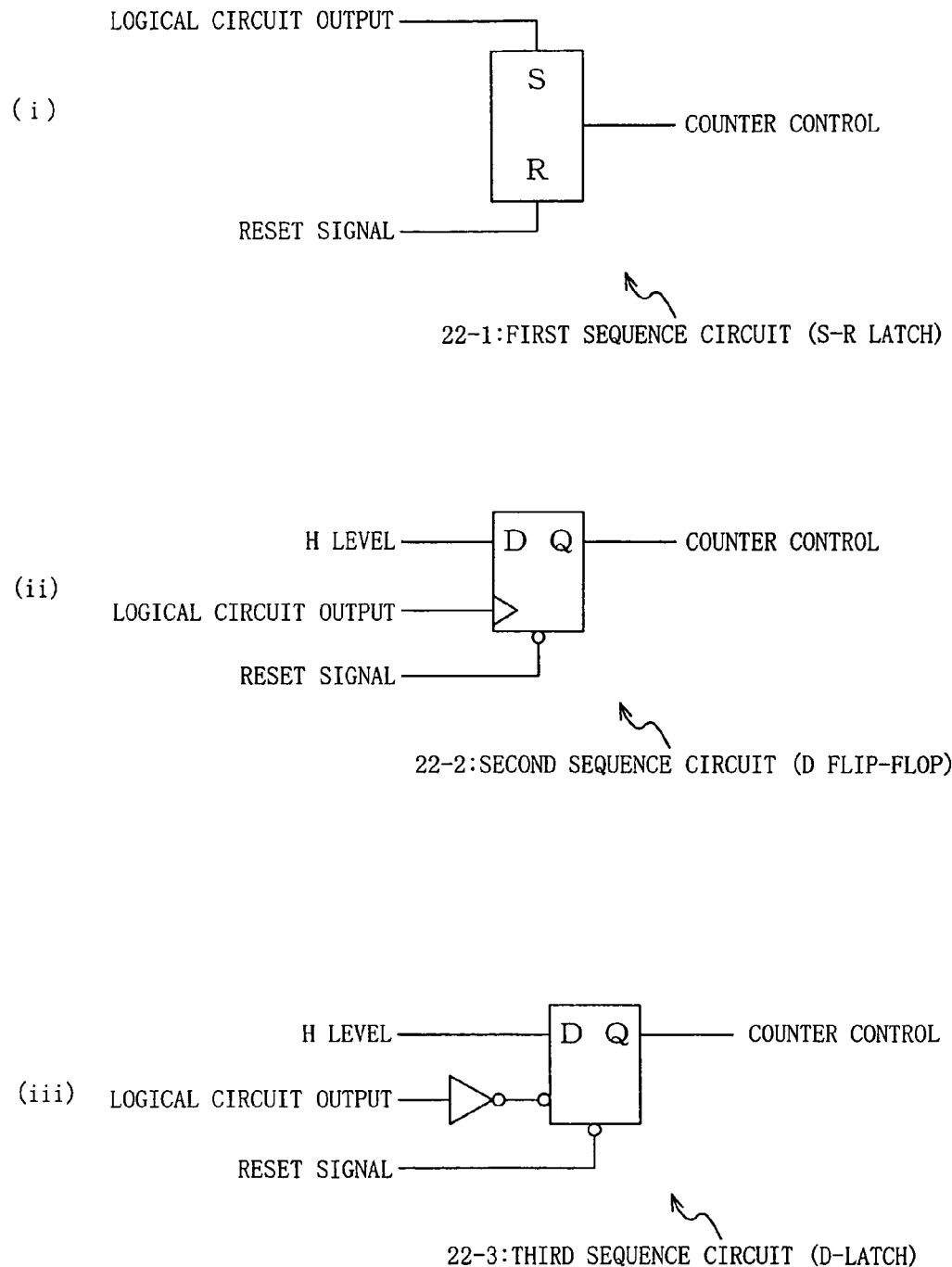
FIG. 4 is a circuit diagram showing a specific example of a sequence circuit constituting the cycle slip detection circuit, (i) shows an S-R latch circuit, (ii) shows a D flip-flop circuit, and (iii) shows a D-latch circuit.

Moreover, as shown in FIG. 4(ii), the sequence circuit 22 may be constituted of a D flip-flop circuit (a second sequence circuit) 22-2. In this D flip-flop circuit 22-2, a signal of an H level is input into a D terminal, an output signal of the logical circuit 21 is input into a CK terminal, and a reset signal is input into a reset terminal. Subsequently, when the output (the phase difference detection signal) of the logical circuit 21 is input into the CK terminal, the H-level signal input into the D terminal is output from a Q terminal.

Furthermore, as shown in FIG. 4(iii), the sequence circuit 22 may be constituted of a D-latch circuit (a third sequence circuit) 22-3. In this D-latch circuit 22-3, the H-level signal is input into a D terminal, an output (the phase difference detection signal) of the reversed logical circuit 21 is input, and a reset signal is input into a reset terminal. Subsequently, when the output (the phase difference detection signal) of the reversed logical circuit 21 is input, the H-level signal input into the D terminal is output from the Q terminal.

The count control means 30 loads a new initially set value on the coarse counter 13b based on the cycle slip detection signal from the cycle slip detection circuit 20.

This count control means 30 is sometimes executed by hardware or software processing.

Figure 5:
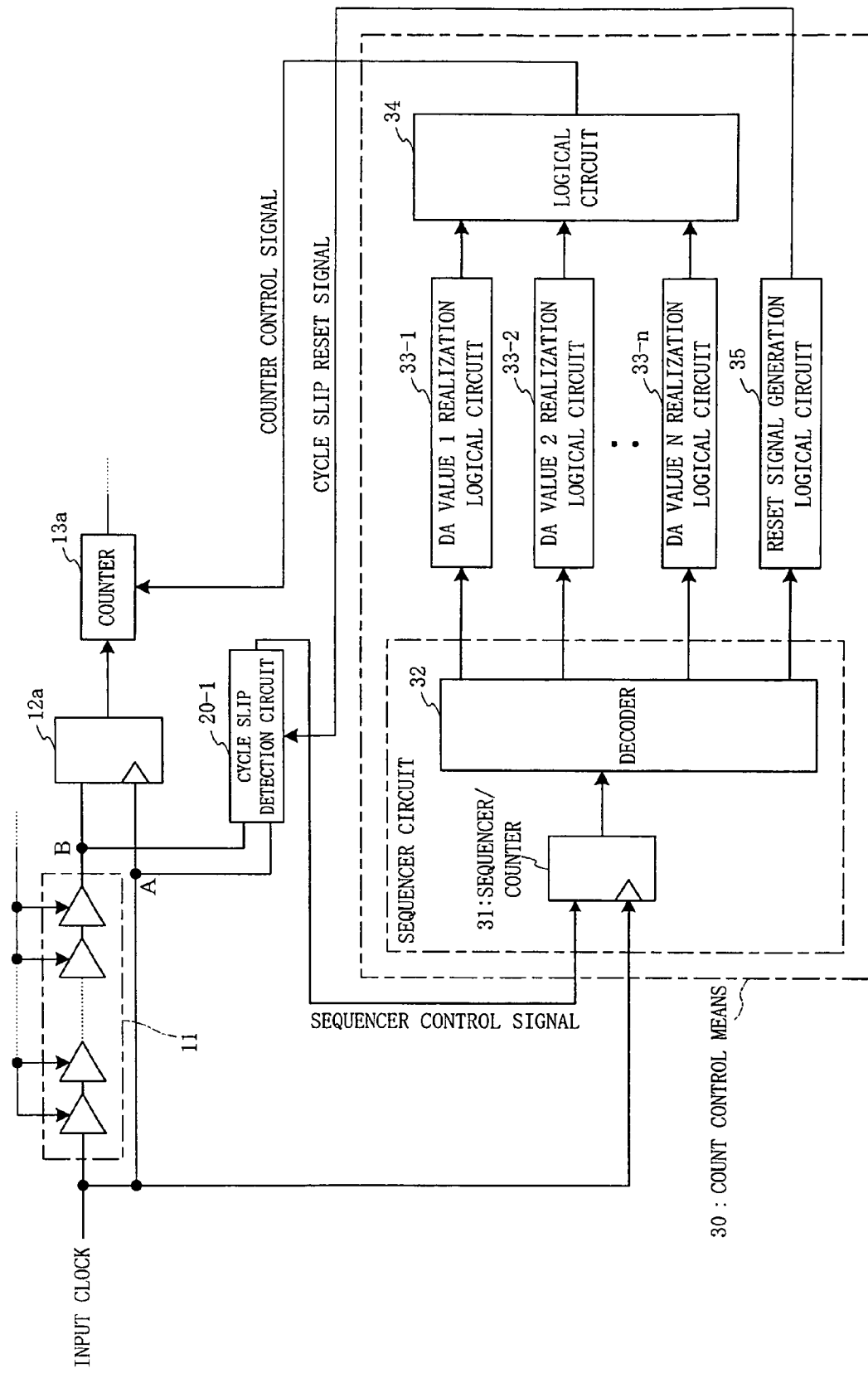
FIG. 5 is a circuit diagram showing a specific constitution of count control means.

As shown in FIG. 5, the count control means 30 executed by the hardware processing includes a sequencer/counter 31, a decoder 32, DA value (1 to N) realization logical circuits 33-1 to 33-n, a logical circuit 34 and a reset signal generation logical circuit 35.

It is to be noted that the sequencer/counter 31 and the decoder 32 are constituted as a sequencer circuit.

Here, the sequencer/counter 31 inputs a sequencer control signal (the cycle slip detection signal) from the cycle slip detection circuit 20-1, and performs counting based on a value indicated by this sequencer control signal to output this count result.

For example, when the sequencer control signal indicates "1" (when the delay lock loop circuit 10-1 causes the cycle slip), the sequencer/counter 31 counts +1. After this count operation, the count value is sent to the decoder 32 in accordance with an input timing of the input signal (an input clock).

On the other hand, when the sequencer control signal indicates "0" (when the delay lock loop circuit 10-1 does not cause any cycle slip), the sequencer/counter 31 does not perform any count operation.

The decoder 32 sends a selection signal to one of the DA value (1 to N) realization logical circuits 33-1 to 33-n or the reset signal generation logical circuit 35 based on the count value from the sequencer/counter 31.

An operation of this decoder 32 will be described with reference to FIG. 6. The drawing is a waveform diagram showing a relation between an output of the sequencer/counter 31 and an operation of the count control means (hardware processing means) 30.

As shown in the drawing, the output (the count value) of the sequencer/counter 31 indicates a value such as "1", "2", "3", ... "30", "31"....

For example, when the count value is "1", a corresponding operation is "DA1 SET", and a selection signal is sent to the DA value 1 realization logical circuit 33-1. When the count value is "11", a corresponding operation is "DA2 SET", and a selection signal is sent to the DA value 2 realization logical circuit 33-2. When the count value is "21", a corresponding operation is "DA3 SET", and a selection signal is sent to the DA value 3 realization logical circuit 33-3. Thus, when the count value is "10 m+1", the selection signal is sent to a corresponding circuit of the DA value (1 to N) realization logical circuits 33-1 to 33-n so as to switch a DA value of the counter 13a.

When the count value is "10 m+9" such as "9", "19", "29" ..., a corresponding operation is "CLR", and the selection signal is sent to the reset signal generation logical circuit 35.

When the count value is a value other than "10 m+1" or "10 m+9", the selection signal is not sent to the DA value (1 to N) realization logical circuits 33-1 to 33-n or the reset signal generation logical circuit 35. That is, when the count value is "2" to "8", "12" to "18", "22" to "28"..., a DA value holding operation is performed from a time when the DA value is set to a time when the delay lock loop circuit 10-1 locks.

Moreover, the DA value holding operation at a time when the count value is "10", "20", "30" is to judge whether or not the cycle slip is caused.

Figure 6:
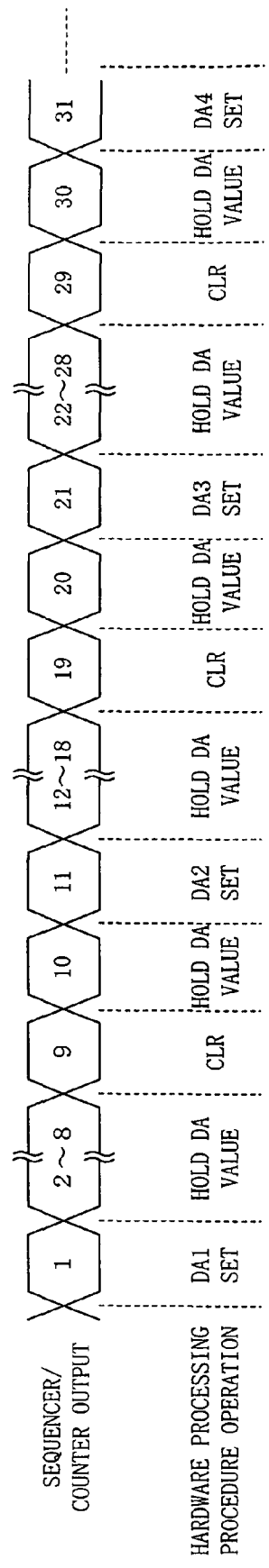
FIG. 6 is a waveform diagram showing an output of a sequencer/counter in the count control means, and an operation of a hardware processing procedure corresponding to each value of this output.

It is to be noted that in FIG. 6, "hold the DA value" is to hold the DA value presently set to the counter 13a as it is.

When the selection signal is provided from the decoder 32, the DA value (1 to N) realization logical circuits 33-1 to 33-n and the logical circuit 34 set a predetermined DA value to the counter 13a (transmission of a counter control signal).

Here, when the selection signal is sent to the DA value 1 realization logical circuit 33-1, "DA1" is set to the counter 13a. When the selection signal is sent to the DA value 2 realization logical circuit 33-2, "DA2" is set to the counter 13a. When the selection signal is sent to the DA value 3 realization logical circuit 33-3, "DA3" is set to the counter 13a. Then, when the selection signal is sent to the DA value N realization logical circuit 33-n, "DA N" is set to the counter 13a.

When the selection signal is sent from the decoder 32, the reset signal generation logical circuit 35 sends the cycle slip reset signal to the sequence circuit 22 of the cycle slip detection circuit 20-1. In consequence, the cycle slip detection circuit 20-1 resets the sequence circuit 22.

Next, an operation of the cycle slip detection circuit will be described with reference to FIGS. 7 to 9.

Figure 7:
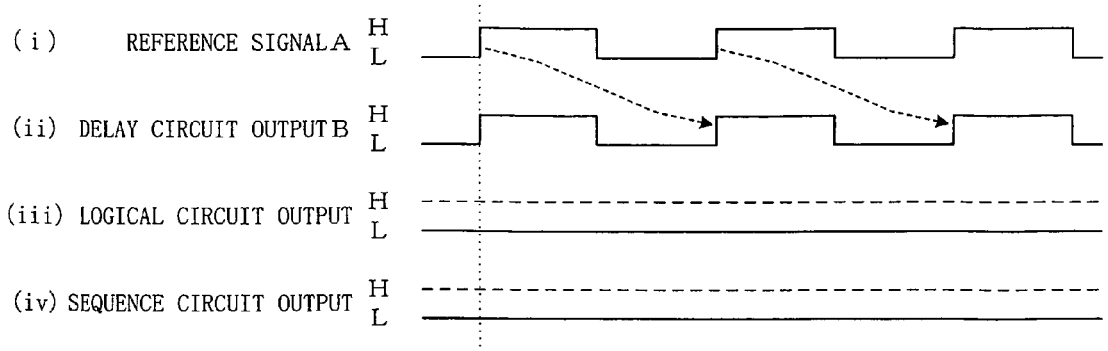
FIG. 7 is a waveform diagram showing each waveform in the cycle slip detection circuit in a locked state.
Figure 8:
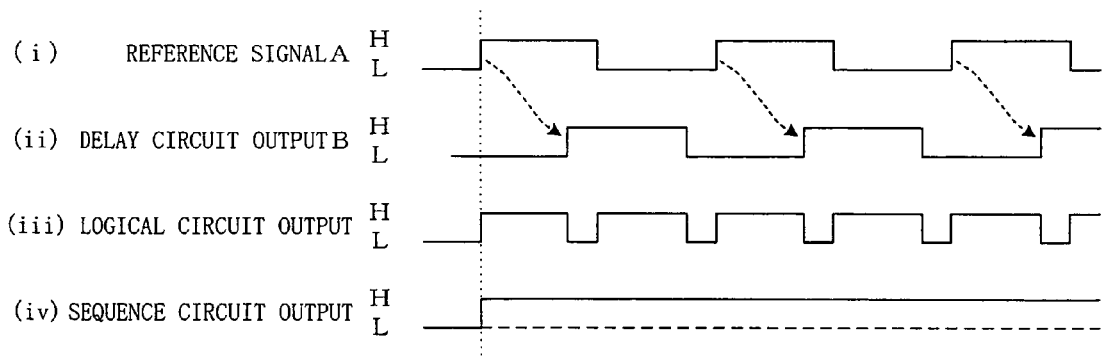
FIG. 8 is a waveform diagram showing each waveform in the cycle slip detection circuit in a case where cycle slip occurs in a direction in which a delay amount shortens.
Figure 9:
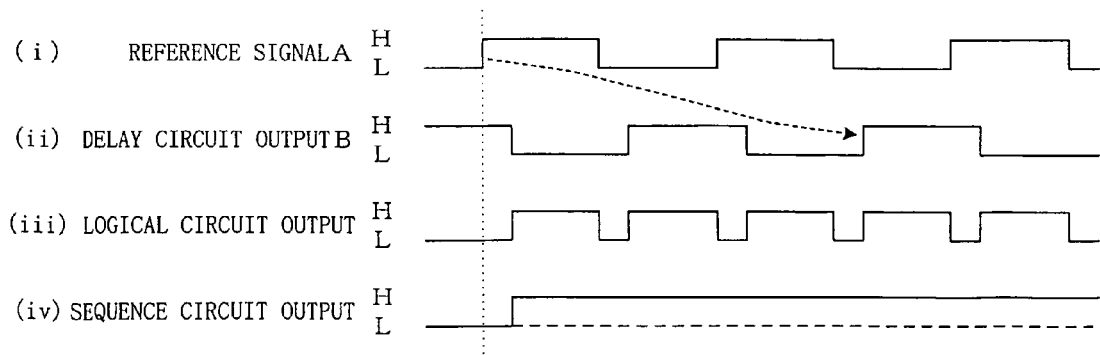
FIG. 9 is a waveform diagram showing each waveform in the cycle slip detection circuit in a case where the cycle slip occurs in a direction in which the delay amount lengthens.

FIG. 7 shows each waveform of the cycle slip detection circuit in a locked state, FIG. 8 shows each waveform of the cycle slip detection circuit in a case where the cycle slip occurs in a direction in which a delay amount decreases, and FIG. 9 shows each waveform of the cycle slip detection circuit in a case where the cycle slip occurs in a direction in which the delay amount increases.

First, the operation of the cycle slip detection circuit during DLL lock will be described with reference to FIG. 7.

The DLL lock time is a state in which an output signal B of the delay circuit 11 is delayed just as much as one cycle as compared with a reference signal A. It is to be noted that the reference signal A is an input signal (a signal of a point A of the DLL 10-1 shown in FIG. 1) of the delay circuit 11. Moreover, the output signal B is an output signal (a signal of a point B of the DLL 10-1 shown in FIG. 1) of the delay circuit 11.

In this case, as shown in FIG. 7, a phase of the reference signal A matches with that of the output signal B, and the cycle slip does not occur (FIGS. 7(*i*), (*ii*)). At this time, an "L"-level signal is output from the logical circuit 21 (FIG. 7(*iii*)), and the "L"-level signal is also output from the sequence circuit 22 (FIG. 7(*iv*)).

Next, an operation of the cycle slip detection circuit at a time when the cycle slip occurs in a direction in which the delay amount decreases will be described with reference to FIG. 8.

In the drawing, a cycle slip state is shown until the value of the coarse counter 13*b* becomes the maximum value or the minimum value, and hence the phases do not match (FIGS. 8(*i*), (*ii*)). At this time, as the output signal of the logical circuit 21, an H-level signal having a glitch with a small pulse width is output (FIG. 8(*iii*)). In consequence, as the output signal of the sequence circuit 22, an H-level signal is output (FIG. 8(*iv*)).

Next, an operation of the cycle slip detection circuit at a time when the cycle slip occurs in a direction in which the delay amount increases will be described with reference to FIG. 9.

In comparison of a case shown in FIG. 9 with the case shown in FIG. 8, they are different from each other in that a phase difference of the delay circuit output B from the reference signal A largely differs, but they are common in that the cycle slip occurs in the output signal B of the delay circuit 11. Therefore, even in the case shown in FIG. 9, the cycle slip state remains until the value of the coarse counter 13*b* becomes the maximum value or the minimum value, and hence the phases do not match each other (FIGS. 9(*i*), (*ii*)). At this time, as the output signal of the logical circuit 21, the H-level signal having a glitch with a small pulse width is output (FIG. 9(*iii*)). In consequence, as the output signal of the sequence circuit 22, the H-level is output (FIG. 9(*iv*)).

Thus, when the cycle slip occurs, the cycle slip detection circuit 20 outputs the "H"-level. On the other hand, when the cycle slip does not occur, the cycle slip detection circuit 20 outputs the "L"-level.

In consequence, the count control means 30 can allow the counter 13*b* to switch the initially set value of the counter based on the cycle slip detection signal output from the cycle slip detection circuit 20.

Figure 10:
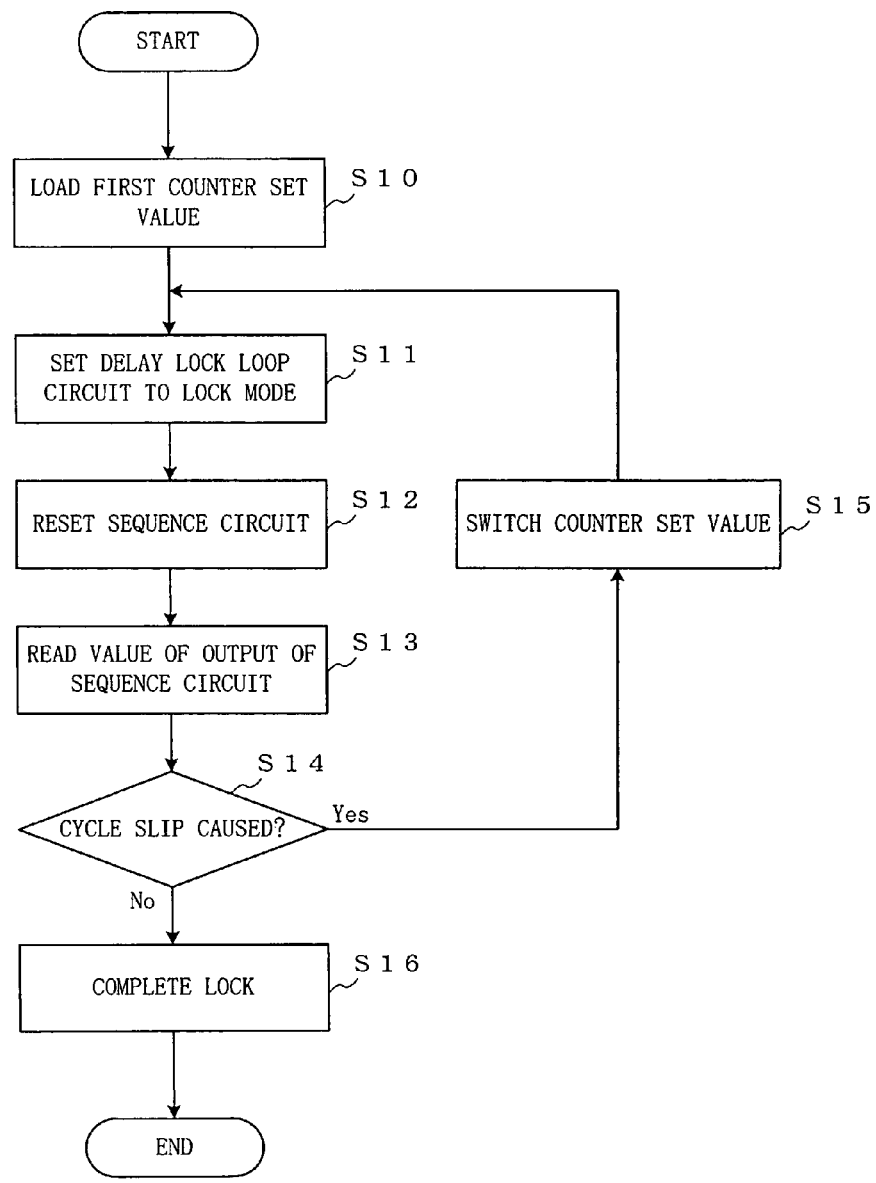
FIG. 10 is a flow chart showing an operation of a constitution of a delay circuit in the delay lock loop circuit according to the first embodiment.

Next, an operation (a delay amount calibration method) from a time when the value of the counter is set to a time when the DLL is locked will be described with reference to FIG. 10.

It is assumed that with regard to the initially set value (the DA value) of the counter, two or more DA values are prepared (the DA value is determined by simulation) so that the DLL can surely be locked with any DA value in any process of a CMOS.

First, when a first DA value of a plurality of DA values is selectively loaded (step 10), the loaded DA value is set to the (coarse) counter 13*b*, and the DLL 10-1 is switched to a lock mode (a lock/non-lock mode switch function, step 11).

Here, a state remains in the sequence circuit 22 until locked, so that the sequence circuit 22 is reset (step 12), and an output of the sequence circuit 22 is read after elapse of WAIT TIME (step 13).

A value indicated by the read output (the cycle slip detection signal) of the sequence circuit 22 is judged (step 14).

As a result of the judgment, in a case where the cycle slip detection signal indicates "H", that is, it is indicated that the cycle slip occurs, the DA value is switched (switching of a counter set value, step 15), and an operation of the steps 11 to 15 is repeated with this switched DA value.

On the other hand, in a case where the cycle slip detection signal indicates "L", that is, it is indicated that the cycle slip does not occur, locking of the DLL is completed (step 16).

The DA value is switched by such a procedure twice or three times until the locking of the DLL is completed, whereby an optimum DA value can easily and simply be found.

Next, a method for selecting the counter initially set value will be described with reference to FIG. 11.

First, two or more DA values are prepared (three values DA1, DA2 and DA3 in the drawing). This is because the DLL can surely be locked with any DA value in any process of a CMOS, and such a value is determined during design (during simulation).

Figure 11:
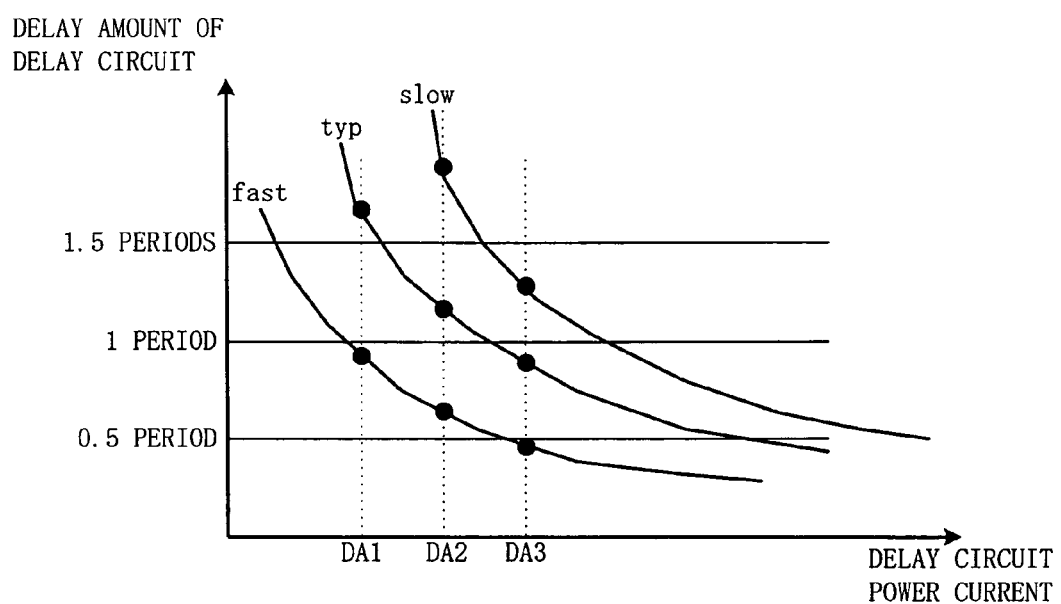
FIG. 11 is a graph showing an initially set value of the counter.

Here, the values DA1, DA2 and DA3 are determined as shown in FIG. 11.

In this case, when DA1 is set to the counter 13*b*, a process "fast" is locked, but processes "typ" and "slow" are not locked.

Moreover, when DA2 is set to the counter 13*b*, the processes "fast" and "typ" are locked, but the process "slow" is not locked.

Furthermore, when DA3 is set to the counter 13*b*, the processes "typ" and "slow" are locked, but the process "fast" is not locked.

Thus, the counter initially set value is determined by simulation so that the DLL can be locked in all the processes.

Then, when the cycle slip is detected, the DA value is switched as in DA1→DA2→DA3.

In consequence, the DLL can surely be locked with any DA value in any process of the CMOS.

As described above, according to the delay lock loop circuit of the present embodiment, the DLL can be locked without measuring any delay amount of the delay circuit, so that the time required for the calibration of the delay circuit can be reduced.

Second Embodiment of Delay Lock Loop Circuit

Next, a second embodiment of a delay lock loop circuit according to the present invention will be described with reference to FIG. 12.

The drawing is a block diagram showing a constitution of the delay lock loop circuit according to the present embodiment.

The present embodiment is different from the first embodiment in a constitution of a cycle slip detection circuit. That is, in the first embodiment, the constitution includes a logical circuit and a sequence circuit, whereas in the present embodiment, the constitution includes a maximum/minimum value detection circuit which detects a maximum value or a minimum value of a counter to perform counter control. Other constituting elements are similar to those of the first embodiment.

Figure 12:
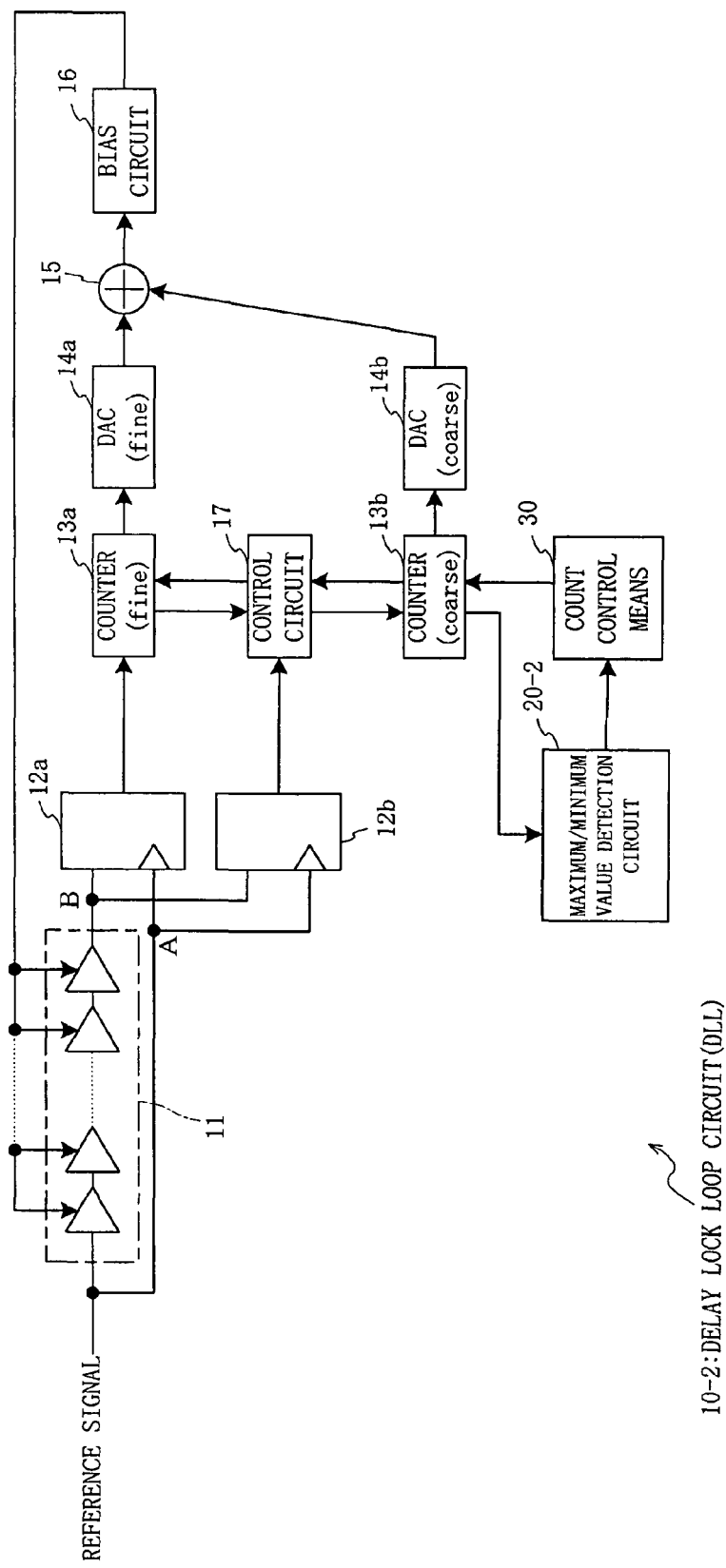
FIG. 12 is a block diagram showing a constitution of a delay lock loop circuit in a second embodiment of the present invention.

Therefore, in FIG. 12, a constituting part similar to FIG. 1 is denoted with the same reference numerals, and detailed description thereof is omitted.

As shown in FIG. 12, a delay lock loop circuit 10-2 has a delay circuit 11, phase comparators 12a, 12b, counters 13a, 13b, DACs 14a, 14b, an adding section 15, a bias circuit 16, a control circuit 17, a maximum/minimum value detection circuit 20-2 and count control means 30.

It is to be noted that the delay circuit 11, the phase comparators 12a, 12b, the counters 13a, 13b, the DACs 14a, 14b, the adding section 15, the bias circuit 16 and the control circuit 17 have functions similar to those of the delay circuit 210, the phase comparators 220a, 220b, the counters 230a, 230b, the DAC 240a, 240b, the adding section 250, the bias circuit 260 and the control circuit 270 in the conventional delay lock loop circuit 200 shown in FIG. 22, and hence detailed description thereof is omitted.

Moreover, the count control means 30 has a function similar to that of the count control means 30 according to the first embodiment of the delay lock loop circuit, and hence detailed description thereof is omitted.

Here, the maximum/minimum value detection circuit 20-2 according to one embodiment of the cycle slip detection circuit 20 reads a count value of the (coarse) counter 13b, and judges whether or not this count value is the maximum value or the minimum value.

As a result of the judgment, when the count value is the maximum value or the minimum value, it is judged that an output signal causes cycle slip. In this case, the count control means 30 performs switch control of a DA value with respect to the counter 13b.

On the other hand, when the count value is not the maximum value or the minimum value, it is judged that the output signal does not cause any cycle slip. In this case, owing to a lockable state, the DA value is not switched.

Figure 13:
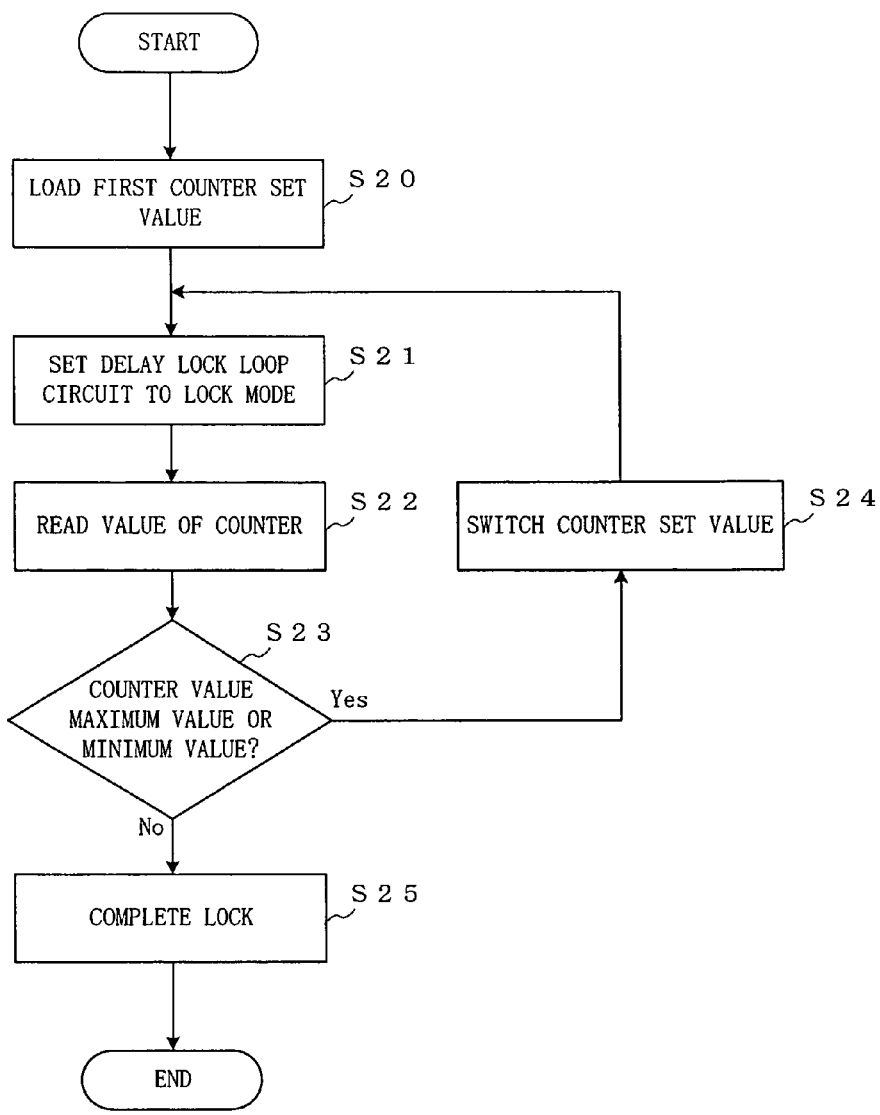
FIG. 13 is a flow chart showing an operation of a constitution of a delay circuit in the delay lock loop circuit according to the second embodiment.

Next, an operation (a delay amount calibration method) from a time when the value of the counter is set to a time when the DLL is locked will be described with reference to FIG. 13.

It is assumed that in the same manner as in the first embodiment, with regard to an initially set value (the DA value) of the counter, two or more DA values are prepared (the DA value is determined by simulation) so that the DLL can surely be locked with any DA value in any process of a CMOS.

First, when a first DA value of a plurality of DA values is selectively loaded (step 20), the loaded DA value is set to the (coarse) counter 13b, and the DLL 10-2 is switched to a lock mode (a lock/non-lock mode switch function, step 21). After elapse of WAIT TIME, a count value of the counter 13b is read (step 22).

It is judged whether this read count value indicates the maximum value or the minimum value (step 23).

As a result of the judgment, when the maximum value or the minimum value is indicated, it is judged that the cycle slip occurs, the DA value is switched (step 24), and an operation of the steps 21 to 23 is executed in this switched DA value.

On the other hand, when the maximum value or the minimum value is not indicated, any cycle slip does not occur, and the locking of the DLL is completed (step 25).

The DA value is switched by such a procedure twice or three times until the locking of the DLL is completed, whereby an optimum DA value can easily and simply be found.

As described above, the constitution includes the maximum/minimum value detection circuit as the cycle slip detection circuit, whereby the DLL can be locked without measuring any delay amount of the delay circuit, and a time required for calibration of the delay circuit can be reduced.

[Timing Generator and Semiconductor Test Device]

Figure 14:
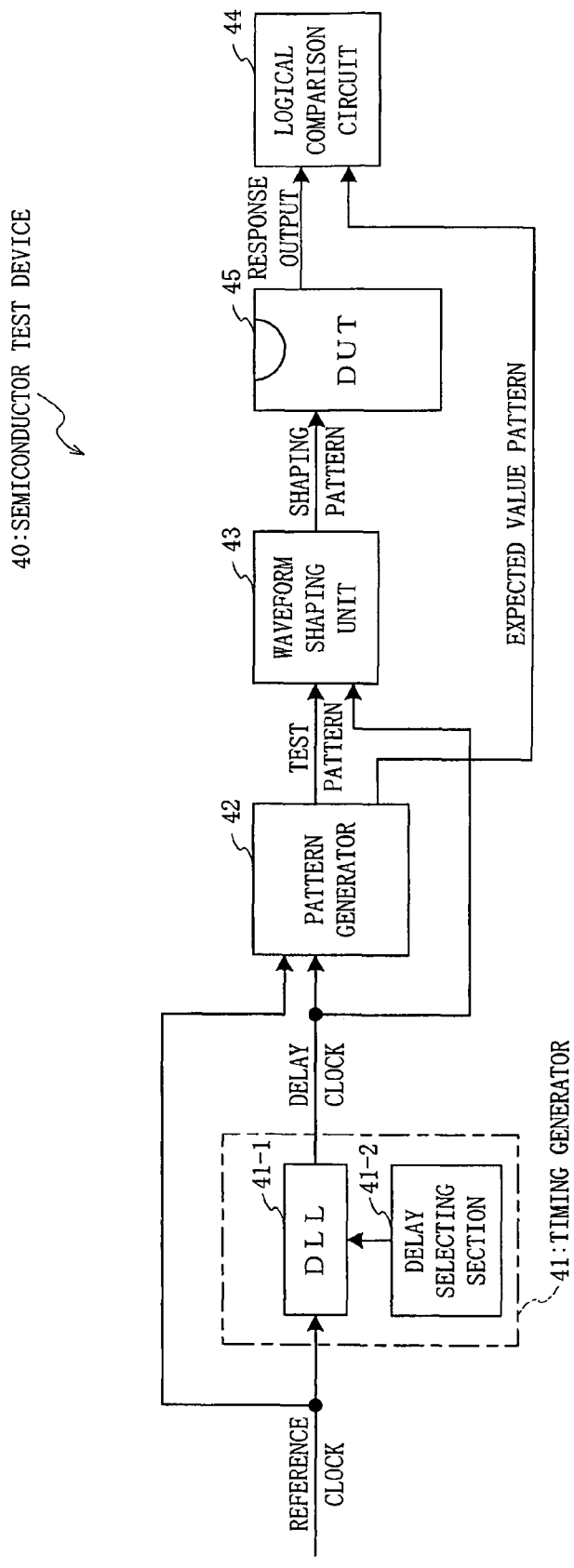
FIG. 14 is a block diagram showing a constitution of a semiconductor test device according to the present invention.

Next, a timing generator of the present embodiment and a semiconductor test device provided with the timing generator will be described with reference to FIG. 14.

As shown in the drawing, a semiconductor test device 40 of the present embodiment includes a timing generator 41, a pattern generator 42, a waveform shaping unit 43 and a logical comparison circuit 44.

The timing generator 41 outputs a delay clock signal in which a reference clock signal is delayed as much as a predetermined time. The pattern generator 42 outputs a test pattern signal in synchronization with the reference clock signal. The waveform shaping unit 43 shapes the test pattern signal in accordance with a device under test (DUT) 45 to send the signal to the DUT 45. The logical comparison circuit 44 compares a response output signal of the DUT 45 with an expected value data signal.

Here, the timing generator 41 includes a delay lock loop circuit (DLL) 41-1 and a delay selecting section 41-2.

Figure 15:
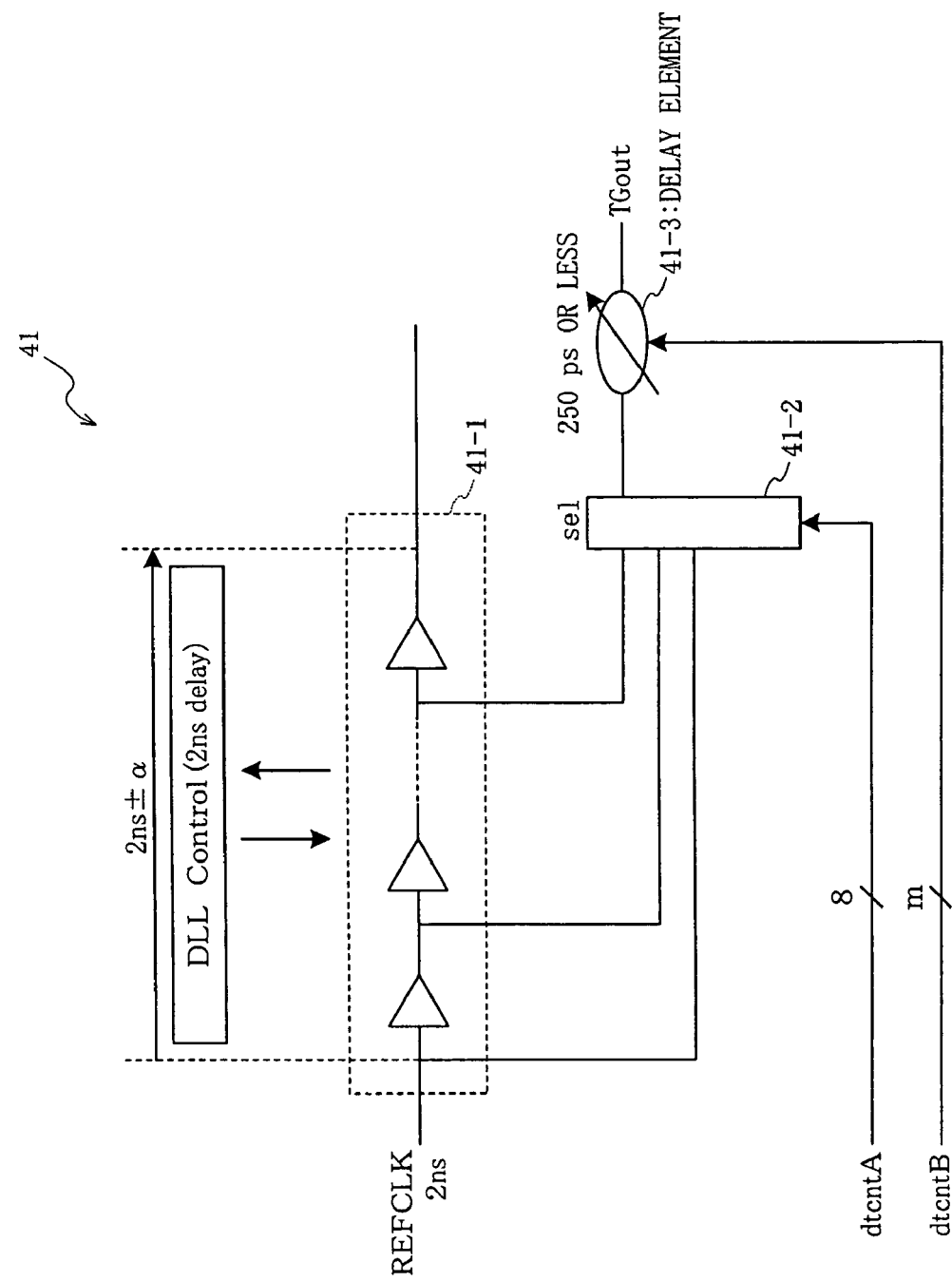
FIG. 15 is a block diagram showing a constitution of a timing generator according to the present invention.

A specific circuit constitution of this timing generator 41 is shown in FIG. 15.

As shown in the drawing, the DLL 41-1 of the timing generator 41 has the same constitution as that of the above DLL of the present invention (e.g., the DLL 10-1 shown in FIG. 1, the DLL 10-2 shown in FIG. 12 or the like), and includes a variable delay circuit in which a plurality of stages of logical gates are connected in series. In addition, an input signal (an input clock) of FIG. 1 corresponds to the reference clock signal of the present embodiment.

The delay selecting section 41-2 selects an output of any inverter to output a delay signal. Furthermore, an example shown in FIG. 15 includes a delay element 41-3 which generates a delay time of 250 ps or less.

According to such a constitution of the timing generator, when the timing generator is provided with one or more DLLs, a time required for calibration of these DLLs can be reduced.

[Semiconductor Integrated Circuit]

Figure 16:
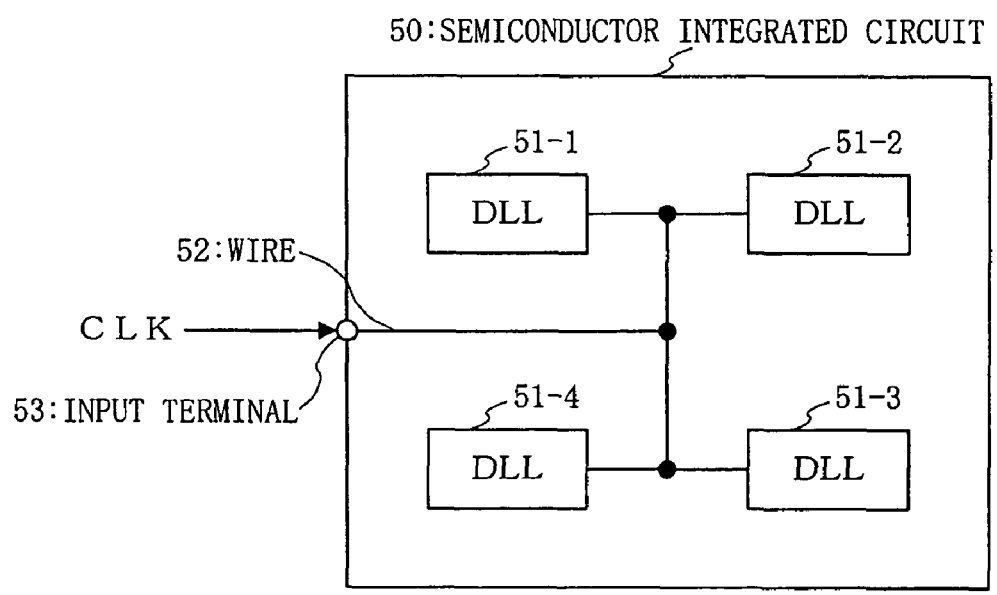
FIG. 16 is a block diagram showing a constitution of a semiconductor integrated circuit according to the present invention.

Next, a semiconductor integrated circuit of the present embodiment will be described with reference to FIG. 16.

As shown in the drawing, a semiconductor integrated circuit 50 of the present embodiment includes, for example, four delay lock loop circuits (DLL) 51-1 to 51-4, and a wire 52 which distributes a low-frequency reference clock signal to the DLLs 51-1 to 51-4.

A constitution of the DLLs 51-1 to 51-4 is the same as that of the above DLL of the present invention (e.g., the DLL 10-1 shown in FIG. 1, the DLL 10-2 shown in FIG. 12 or the like).

Then, the low-frequency reference clock signal having small skew is input as an input signal into the DLLs 51-1 to 51-4, and a high-frequency operation clock can be multiplied in the DLLs 51-1 to 51-4. As a result, a relay buffer of a clock signal is not required, the skew of the clock signal can be reduced, and design can be facilitated.

Moreover, in actual, the skew of the reference clock signal is mainly generated owing to a transmission time of a reference clock by the wire 52 from an input terminal 53 to the DLLs 51-1 to 51-4. Therefore, in the present embodiment, lengths of wires from the input terminal 52 of the reference clock to the DLLs 51-1 to 51-4 are set to be equal.

According to the semiconductor integrated circuit having such a constitution, in a case where the timing generator includes one or more DLLs mounted on this semiconductor integrated circuit, a time required for calibration of these DLLs can be reduced.

In addition, CLK transmission in a long distance is performed at a low frequency, and multiplication is performed using the DLL in a local section, so that a circuit scale and power consumption in a transmitting section can be reduced. The whole buffer stage number is minimized, and skew can be reduced.

The preferable embodiments of the delay lock loop circuit, the timing generator, the semiconductor test device, the semiconductor integrated circuit and the delay amount calibration method according to the present invention have been described above, but the delay lock loop circuit, the timing generator, the semiconductor test device, the semiconductor integrated circuit and the delay amount calibration method according to the present invention are not limited to the above embodiments. Needless to say, the present invention can variously be altered or implemented in the scope of the present invention.

For example, according to the above first and second embodiments, the delay lock loop circuit includes two phase comparators 12, two counters 13 and two DA converters 14, and further includes the control circuit 17, but the delay lock loop-circuit of the present invention is not limited to such a constitution.

Figure 17:
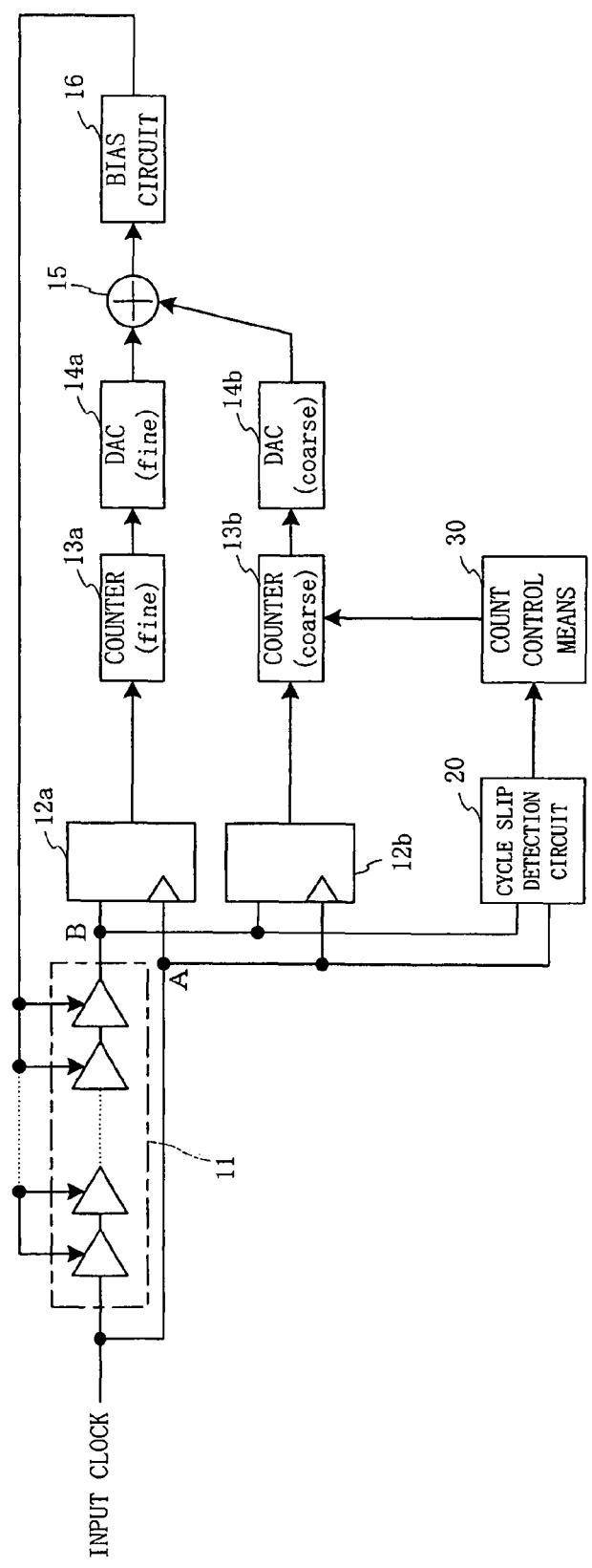
FIG. 17 is a block diagram showing another constitution of the delay lock loop circuit according to the present invention.

For example, as shown in FIG. 17, even a delay lock loop circuit 10-3 which is not provided with the control circuit 17 includes a cycle slip detection circuit 20 and count control means 30, whereby cycle slip can automatically be detected, and calibration of a delay circuit can quickly be performed.

Figure 18:
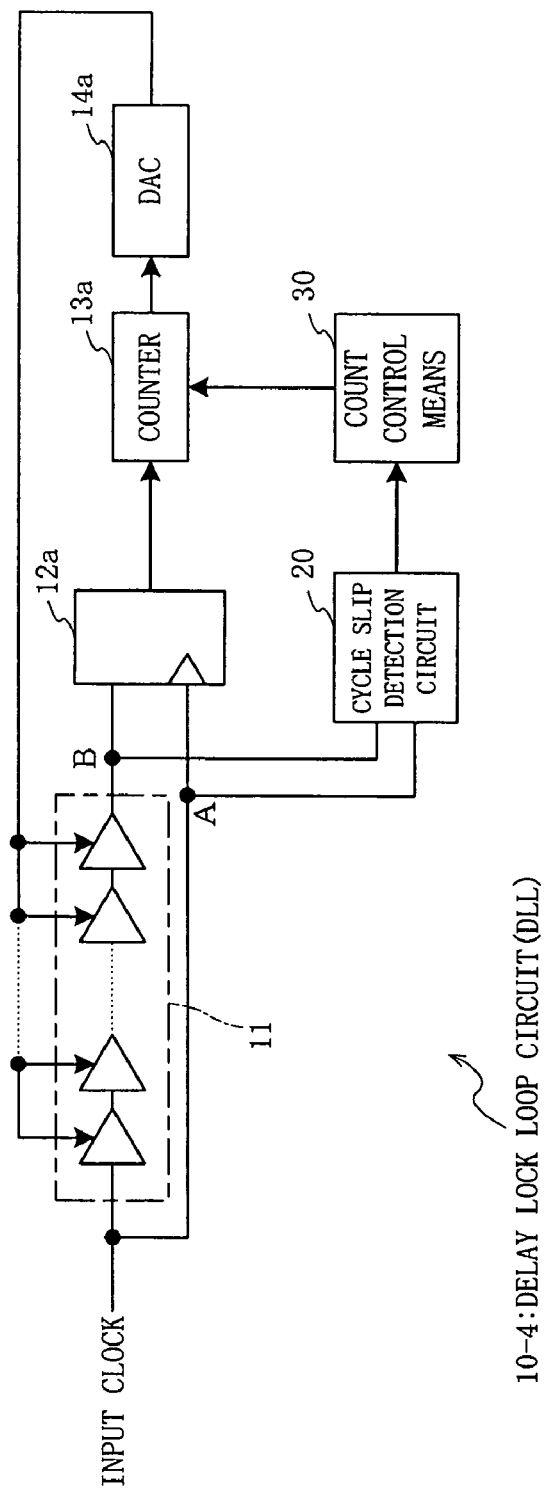
FIG. 18 is a block diagram showing still another constitution of the delay lock loop circuit according to the present invention.
Figure 19:
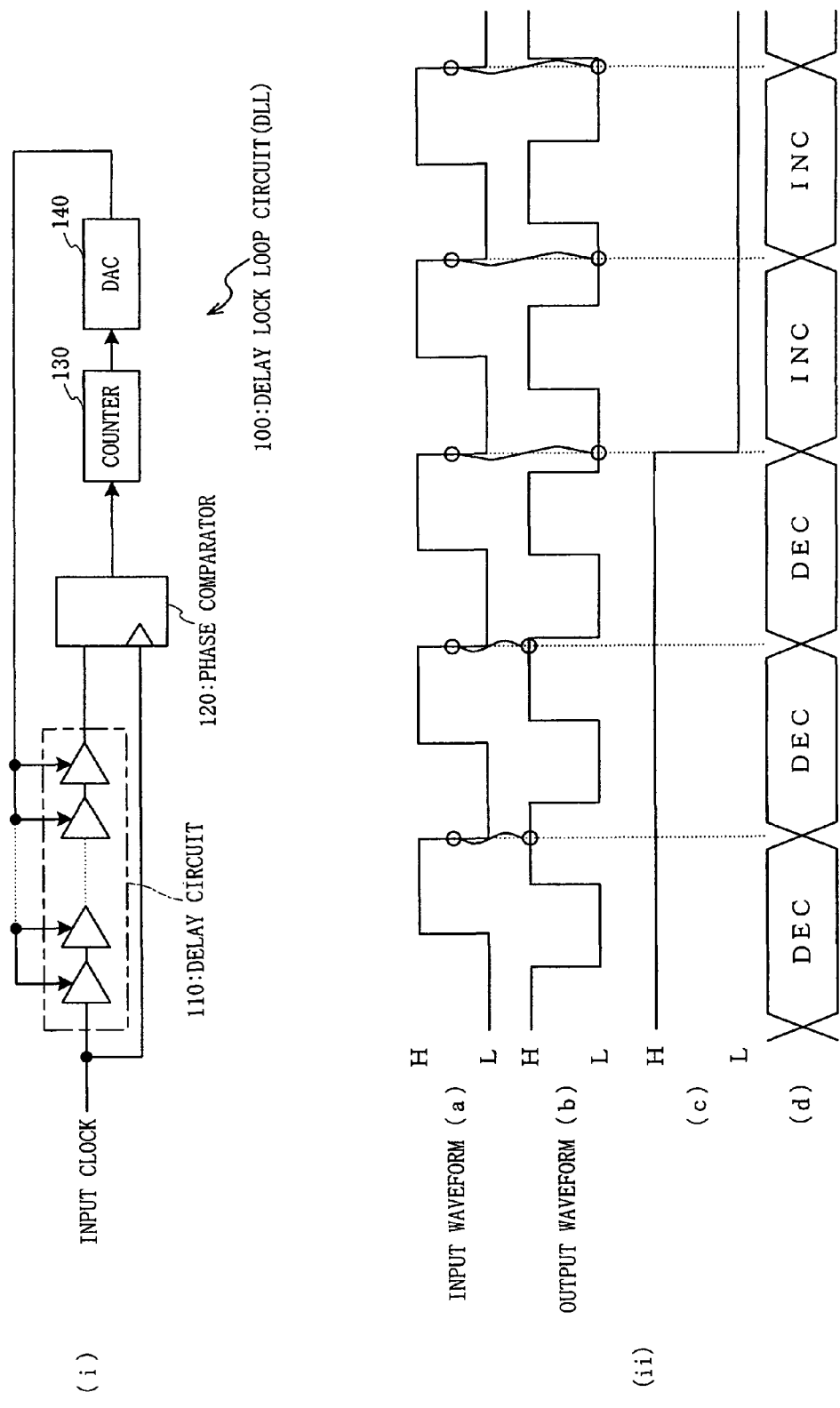
FIG. 19 shows a circuit diagram showing a constitution of a conventional delay lock loop circuit, and a waveform diagram showing a change of each signal with time in this delay lock loop circuit.
Figure 20:
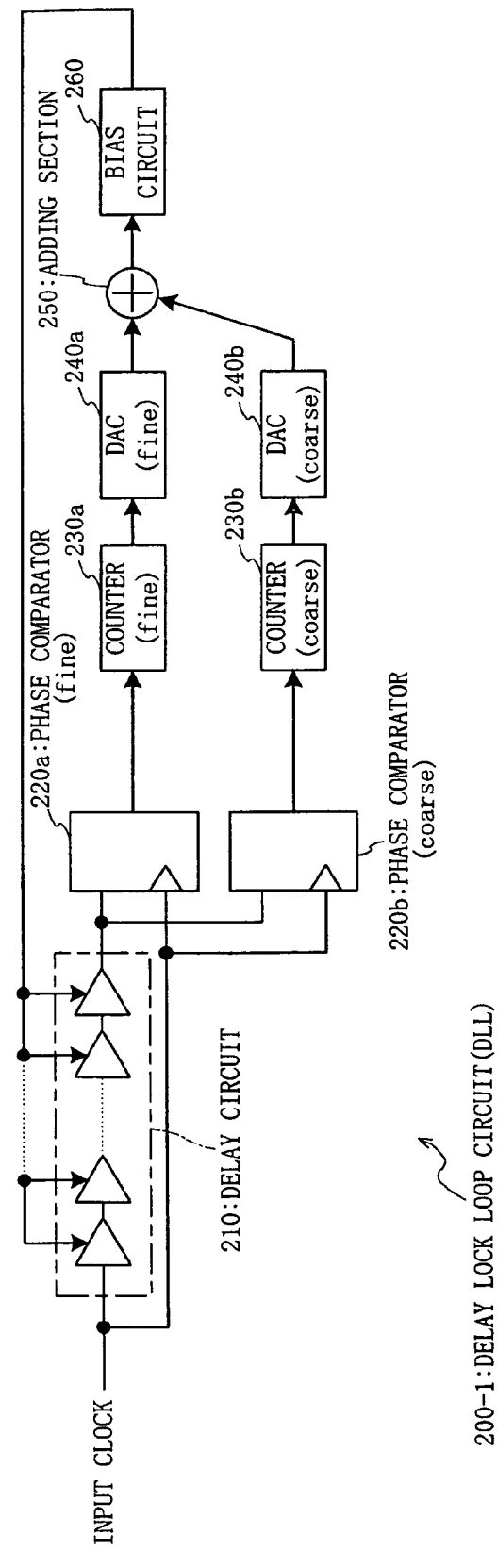
FIG. 20 is a circuit diagram showing another constitution of the conventional delay lock loop circuit.
Figure 21:
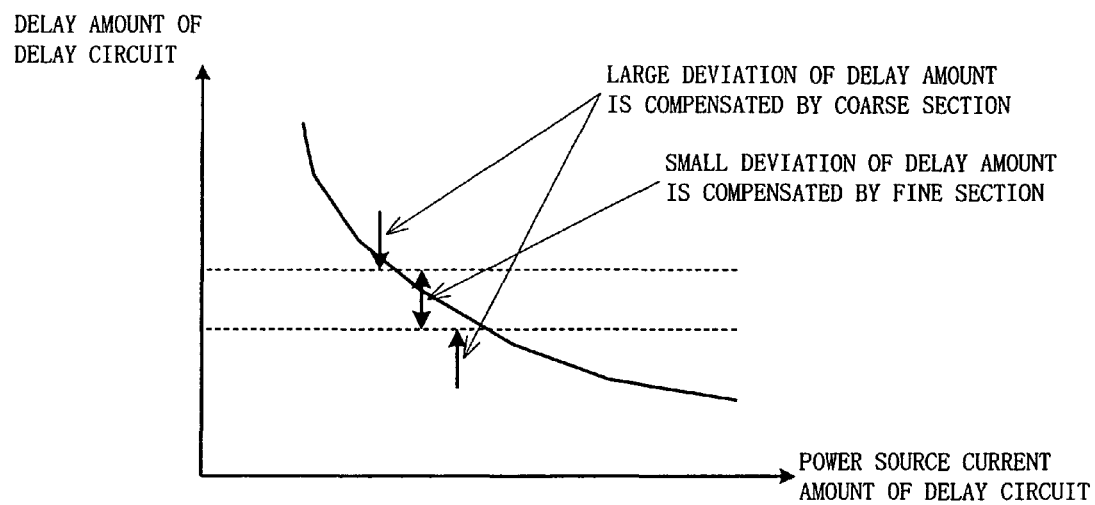
FIG. 21 is a graph showing a situation in which an output signal is locked in the conventional delay lock loop circuit.

Furthermore, as shown in FIG. 18, even a delay lock loop circuit 10-4 which is provided with one phase comparator 12, one counter 13 and one DA converter 14 and which is not provided with the adding section 15, the bias circuit 16 and the control circuit 17 includes a cycle slip detection circuit 20 and count control means 30, whereby a similar effect can be obtained.

That is, the delay lock loop circuit 10-4 provided with an only fine system includes the cycle slip detection circuit 20, and a function of loading at least two or three different DA values onto the fine counter 13 is provided, whereby an operation can be performed.

For example, on conditions that a counter having a maximum count value of 1000 can be loaded with values of "0", "500" and "1000", and has a count value (between 1 and 1000) lockable even with a fluctuation of any process or the like and that cycle slip does not occur with at least one setting of these three count values, the operation can be performed.

The present invention is directed to calibration of a delay circuit in a delay lock loop circuit, and hence the present invention is usable in a device or an apparatus on which the delay lock loop circuit is mounted.

The invention claimed is:

1. A delay lock loop circuit comprising:
   a delay circuit in which a plurality of delay elements each having an equal delay amount are connected in tandem series and which supplies a predetermined delay amount to an input signal to output the delayed signal as an output signal;
   a phase comparator which outputs a phase signal based on a phase difference between the input signal and the output signal;
   a counter which receives the phase signal from the phase comparator to output a control signal;
   a delay time acquiring section which receives the control signal from the counter to output a delay time signal;
   a cycle slip detection circuit which detects whether or not the output signal causes cycle slip, the cycle slip detection circuit comprising a logical circuit which receives the input signal and the output signal to output a phase difference detection signal indicating whether or not a phase of the input signal matches that of the output signal; and a sequence circuit which outputs a cycle slip detection signal indicating whether or not the output signal causes the cycle slip on the basis of the phase difference detection signal from the logical circuit; and
   count control means for controlling a count value of the counter in a case where it is detected that the cycle slip is caused.

2. The delay lock loop circuit according to claim 1, wherein the logical circuit is comprised of:
   a circuit in which an AND circuit and a negative circuit to deny one input signal of this AND circuit are combined; or
   an exclusive OR circuit.

3. The delay lock loop circuit according to claim 1, wherein the sequence circuit includes one or more S-R latch circuits, a D flip-flop circuit and a D-latch circuit.

4. The delay lock loop circuit according to claim 1, wherein the delay time acquiring section has a plurality of delay time acquiring sections each having different resolutions,
   a plurality of counters are provided corresponding to the plurality of delay time acquiring sections, and
   the count control means controls a count value of the counter provided corresponding to the delay time acquiring section having a coarse resolution.

5. A timing generator comprising:
   a delay lock loop circuit including a delay circuit in which a plurality of delay elements each having an equal delay amount are connected in series to provide a predetermined delay amount to an input signal to output the delayed signal as an output signal; and
   a delay selecting section which selects an output of one of the delay elements to generate the output as a delay signal,
   wherein the delay lock loop circuit further comprising:
      a phase comparator which outputs a phase signal based on a phase difference between the input signal and the output signal;
      a counter which receives the phase signal from the phase comparator to output a control signal;
      a delay time acquiring section which receives the control signal from the counter to output a delay time signal;
      a cycle slip detection circuit which detects whether or not the output signal causes cycle slip, the cycle slip detection circuit comprising a logical circuit which receives the input signal and the output signal to output a phase difference detection signal indicating whether or not a phase of the input signal matches that of the output signal; and a sequence circuit which outputs a cycle slip detection signal indicating whether or not the output signal causes the cycle slip on the basis of the phase difference detection signal from the logical circuit; and
      count control means for controlling a count value of the counter in a case where it is detected that the cycle slip is caused.

6. A semiconductor test device comprising:
   a timing generator to output a delay clock signal in which a reference clock signal is delayed by a predetermined time;
   a pattern generator which outputs a test pattern signal in synchronization with the reference clock signal;
   a waveform shaping unit which shapes the test pattern signal in accordance with a device under test to apply the signal to the device under test; and a logical comparator which compares a response output signal of the device under test with an expected value data signal, wherein the timing generator comprising:
- a delay lock loop circuit including a delay circuit in which a plurality of delay elements each having an equal delay amount are connected in series to provide a predetermined delay amount to an input signal to output the delayed signal as an output signal; and
- a delay selecting section which selects an output of one of the delay elements to generate the output as a delay signal;

wherein the delay lock loop circuit further comprising:
- a phase comparator which outputs a phase signal based on a phase difference between the input signal and the output signal;
- a counter which receives the phase signal from the phase comparator to output a control signal;
- a delay time acquiring section which receives the control signal from the counter to output a delay time signal;
- a cycle slip detection circuit which detects whether or not the output signal causes cycle slip, the cycle slip detection circuit comprising a logical circuit which receives the input signal and the output signal to output a phase difference detection signal indicating whether or not a phase of the input signal matches that of the output signal; and a sequence circuit which outputs a cycle slip detection signal indicating whether or not the output signal causes the cycle slip on the basis of the phase difference detection signal from the logical circuit; and
- count control means for controlling a count value of the counter in a case where it is detected that the cycle slip is caused.

7. A semiconductor integrated circuit comprising:
- a plurality of delay lock loop circuits each having an equal oscillation frequency; and
- a wire which distributes, to the delay lock loop circuits, a reference clock signal having a frequency lower than the oscillation frequency, wherein the delay lock loop circuit comprising:
- a delay circuit in which a plurality of delay elements each having an equal delay amount are connected in series to provide a predetermined delay amount to an input signal to output the delayed signal as an output signal;
- a delay selecting section which selects an output of one of the delay elements to generate the output as a delay signal;
- a phase comparator which outputs a phase signal based on a phase difference between the input signal and the output signal;
- a counter which receives the phase signal from the phase comparator to output a control signal;
- a delay time acquiring section which receives the control signal from the counter to output a delay time signal;
- a cycle slip detection circuit which detects whether or not the output signal causes cycle slip, the cycle slip detection circuit comprising a logical circuit which receives the input signal and the output signal to output a phase difference detection signal indicating whether or not a phase of the input signal matches that of the output signal; and a sequence circuit which outputs a cycle slip detection signal indicating whether or not the output signal causes the cycle slip on the basis of the phase difference detection signal from the logical circuit; and
- count control means for controlling a count value of the counter in a case where it is detected that the cycle slip is caused.

* * * * *